United States Patent [19]
Yamazaki et al.

[11] Patent Number: 5,383,041
[45] Date of Patent: Jan. 17, 1995

[54] ELECTRO-OPTICAL DEVICE

[75] Inventors: Shunpei Yamazaki, Tokyo; Akira Mase, Aichi, both of Japan

[73] Assignee: Semiconductor Energy Laboratory Co., Ltd., Kanagawa, Japan

[21] Appl. No.: 104,935

[22] Filed: Aug. 12, 1993

Related U.S. Application Data

[63] Continuation of Ser. No. 805,521, Dec. 13, 1991, abandoned.

[30] Foreign Application Priority Data

Dec. 20, 1990 [JP] Japan ................................. 2-418291
Dec. 29, 1990 [JP] Japan ................................. 2-418664

[51] Int. Cl.[6] ........................................... G02F 1/1343
[52] U.S. Cl. ....................... 359/59; 359/51; 359/85; 345/206
[58] Field of Search .............. 359/54, 59, 85, 51, 359/52; 340/784

[56] References Cited

U.S. PATENT DOCUMENTS

| | | | |
|---|---|---|---|
| 4,818,077 | 4/1989 | Ohwada et al. | 359/59 |
| 5,082,351 | 1/1992 | Fergason | 359/51 |
| 5,132,820 | 7/1992 | Someya et al | 359/54 |

FOREIGN PATENT DOCUMENTS

| | | | |
|---|---|---|---|
| 0144297 | 12/1978 | Japan | 359/59 |
| 0096636 | 4/1988 | Japan | 359/59 |
| 0068724 | 3/1989 | Japan | 340/784 |
| 0107237 | 4/1989 | Japan | 340/784 |

*Primary Examiner*—William L. Sikes
*Assistant Examiner*—Huy Mai
*Attorney, Agent, or Firm*—Sixbey, Friedman, Leedom & Ferguson

[57] ABSTRACT

An electro-optical device is disclosed. The electro-optical device comprises pixels arranged in rows and columns. Each pixel comprises at least one complementary TFT (thin film transistor) pair. Each complementary TFT pair consists of an n-channel TFT and a p-channel TFT. The gates of the complementary TFTs of each pixel are all connected to a signal line extending in the Y-direction. The input terminals of the TFTs of each pixel are connected to a pair of signal lines extending in the X-direction. Each pixel has at least one pixel electrode connected to the outputs of the TFTs thereof. In the operation of the electro-optical device, an electric signal is applied to the pair of signal lines extending in the X-direction and an electric signal is applied to the signal line extending in the Y-direction for the duration of the electric signal applied to the pair of signal lines extending in the X-direction.

18 Claims, 23 Drawing Sheets

F I G. 1
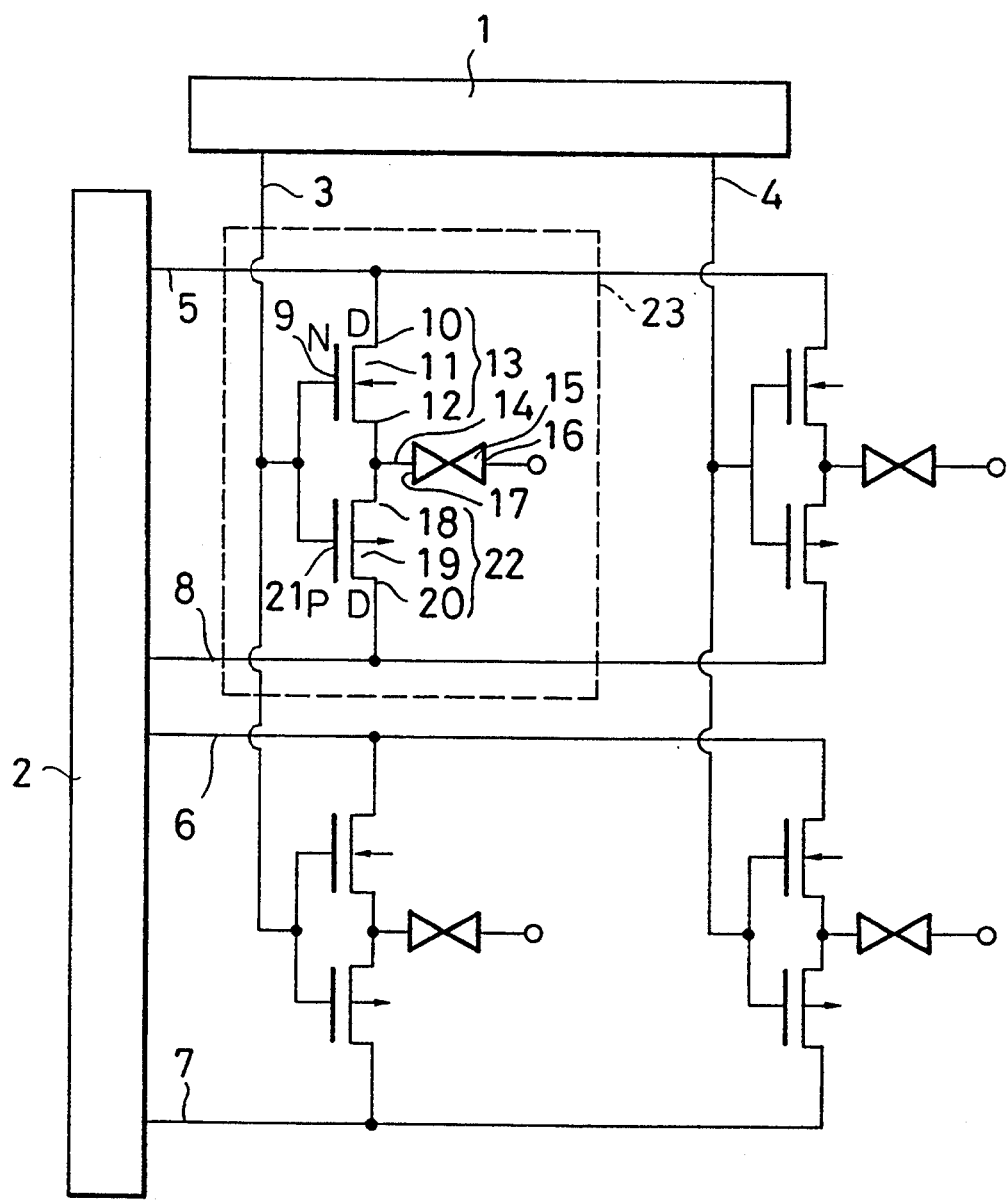

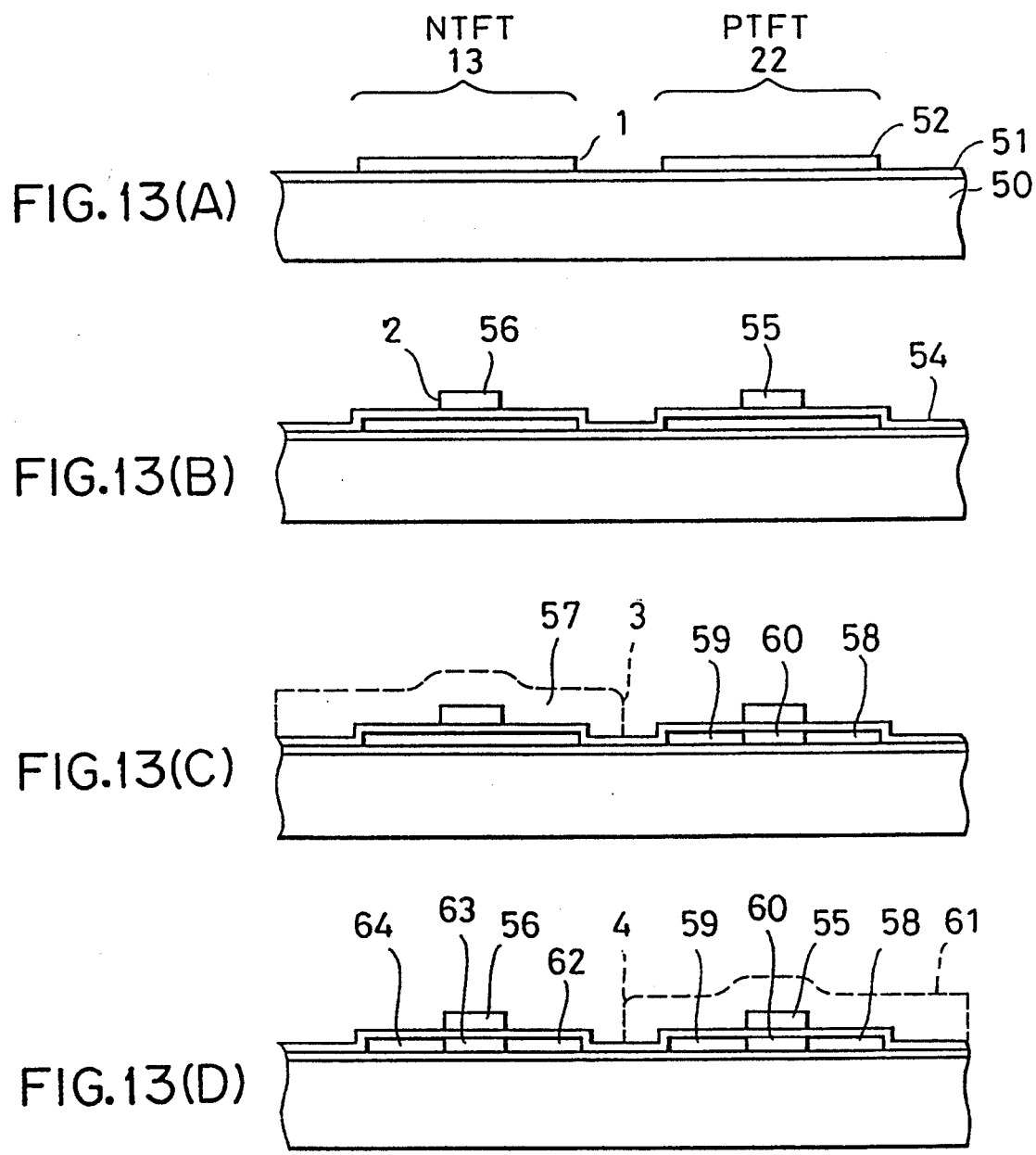

ELECTRO-OPTICAL DEVICE

This application is a continuation of Ser. No. 07/805,521, filed Dec. 13, 1991, now abandoned.

FIELD OF THE INVENTION

The present invention relates to an electro-optical device and, more particularly, to a liquid crystal electro-optical device comprising thin-film transistors. It also relates to a method of driving an electro-optical device.

BACKGROUND OF THE INVENTION

Known liquid crystal electro-optical devices are TN type liquid crystal electro-optical devices using nematic liquid crystals, STN type liquid crystal electro-optical devices using nematic liquid crystals, ferroelectric liquid crystal electro-optical devices, and dispersion liquid crystal electro-optical devices. In a dispersion liquid crystal electro-optical device, a liquid crystal layer comprising a nematic, cholesteric, or smectic liquid crystal dispersed in a solid-phase polymer is sandwiched between a pair of substrates. The sandwiched liquid crystal is maintained in a particulate or spongy state. A known method of forming this liquid crystal layer consists in dispersing the liquid crystal in the polymer and shaping the polymer into a thin film on a substrate or a film. The liquid crystal is dispersed in the polymer by encapsulating the liquid crystal in a material. Materials which have been proposed as encapsulating materials include gelatin, gum arabic, and polyvinyl alcohol.

In these techniques, those liquid crystal molecules which are encapsulated in polyvinyl alcohol and exhibit a positive dielectric anisotropy in a thin film are lined up in the direction of the electric field in the presence of this field. If the liquid crystal is identical in refractive index to the polymer, transparency appears. On the other hand, where there exists no electric field, the molecules of the liquid crystal do not line up in a given direction; rather they are oriented randomly. Therefore, the liquid crystal differs in refractive index from the polymer. The incident light is scattered, and transmission of the light is hindered. In this state, the device appears white and cloudy. In this way, the encapsulated liquid crystal molecules are dispersed in a thin film polymer. Some structures are known other than the above structure. For example, in one structure, a liquid crystal material is dispersed in epoxy resin. Another structure utilizes phase separation between a liquid crystal and a photocurable substance. In a further structure, a liquid crystal is immersed in polymeric molecules which are bonded together in three dimensions. These liquid crystal electro-optical devices are herein collectively referred to as dispersion liquid crystal electro-optical devices.

One of the factors which determine the properties of a dispersion liquid crystal electro-optical device is the degree of dispersion in the region where the liquid crystal exists. In particular, in the structure comprising encapsulated liquid crystal molecules, the determining factor is the degree of dispersion of the capsules. In the structure using a polymer, the factor is the degree of dispersion of spatial portions. Where their uniformity is not good, the average electro-optical property of the liquid crystal material does not show steepness. Hence, the threshold value for activating the device is not fixed. A typical example of electro-optical properties of dispersion liquid crystals is shown in FIG. 14.

One method for solving this problem is to determine the threshold value, using thin film transistors (TFTs), called active devices. Also, this method is indispensable. Usually, n-channel TFTs are used in dispersion liquid crystal devices. Where only one kind of n-channel and p-channel TFTs is used to activate the device, it is impossible to sufficiently suppress the leakage current in off state. Therefore, it is necessary to form independent capacitive elements parallel with the capacitive components of the liquid-crystal element. FIG. 15 shows the structure of a typical liquid crystal device using TFTs of a single channel.

It is known that active liquid crystal electro-optical devices using TFTs have excellent performance. The TFTs are fabricated from an amorphous or polycrystalline semiconductor. One pixel is formed by a thin-film transistor of one conductivity type, i.e., either p- or n-type. Generally, an n-channel thin film transistor (NTFT) is connected in series with each pixel electrode. A typical example is shown in FIG. 5.

Generally, an active-matrix, liquid crystal electro-optical device has very numerous pixels, for example, 480×640 or 1260×960. To simplify the illustration, a matrix arrangement of 2×2 is shown in FIG. 5, where plural gate lines $G_1$ and $G_2$ and plural signal lines $D_1$ and $D_2$ are arranged so as to intersect each other. Pixel elements are installed at the intersections. Each pixel element comprises a liquid crystal portion 82 and a thin film transistor (TFT) portion 81. Signals are applied to the pixel elements from peripheral circuits 88 and 87 to selectively activate the pixels, for providing desired display.

However, where this liquid crystal electro-optical device is manufactured in practice and a display is provided, the output voltage $V_{LC}$ 80 from each TFT, or the input voltage to the liquid crystal, frequently does not go high when it should go high. Conversely, when it should go low, it often fails to go low. This is because the characteristic of each switching device applying a signal to a pixel electrode lacks symmetry. Specifically, the electrical characteristic of the charging to each pixel electrode is different from the electrical characteristic of the discharging from the electrode. Intrinsically, the liquid crystal 82 is insulative in operation. When the TFT is not conducting, the liquid-crystal potential $V_{LC}$ is in a floating condition. Since the liquid crystal 82 is equivalently a capacitor, the potential $V_{LC}$ is determined by the electric charge stored in it. Leakage of this electric charge takes place where the liquid crystal takes a comparatively small resistance of $R_{LC}$, where dust or impurity ions exist, or where a resistance $R_{GS}$ 85 is formed because of pinholes in the gate insulating film of each TFT. Under this condition, the potential $V_{LC}$ does not take an intended value. Consequently, a high production yield cannot be achieved for a liquid crystal electro-optical device comprising one panel having 200 thousand to 5 million pixels.

Where a twisted nematic liquid crystal is used as the liquid crystal 82, a rubbed orientation film is formed on each electrode to orientate the liquid crystal. During the rubbing, static electricity is produced. This causes a weak dielectric breakdown. As a result, leakage takes place between adjacent pixels or conductors. Also, leakage occurs where the gate insulating film is weak.

It is quite important for an active liquid crystal electro-optical device that the liquid-crystal potential, or the input voltage to the liquid crystal, be maintained at the given initial value during one frame. In practice, however, active devices often malfunction. The practical situation is that the liquid-crystal potential is not always retained at the initial value during one frame.

When the liquid crystal is driven by supplying a signal thereto, if a large amount of one of positive voltage and negative voltage is applied to the liquid crystal as compared with the other, then electrolysis occurs, attacking or denaturing the liquid crystal material. In consequence, a satisfactory display cannot be provided. In order to solve such a problem, an AC signal is supplied. However, this AC signal is quite complex.

SUMMARY OF THE INVENTION

It is an object of the present invention to provide an electro-optical device which has a larger current margin, hence high response speed, and in which the input voltage applied to each pixel electrode, or the liquid crystal potential $V_{LC}$, is sufficiently stably maintained either at 1 (high state) or 0 (low state) such that the level of the potential does not drift during one frame.

It is another object of the invention to provide a dispersion liquid crystal electro-optical device which has wide substrates, and in which desired threshold values are secured by the action of active elements to compensate for nonuniform dispersion of liquid crystal molecules.

The foregoing objects of the present invention are achieved by an electro-optical device comprising:
- a pair of substrates at least one of which is transparent;
- a liquid crystal layer disposed between said substrates, said layer comprising a transparent solid and a material comprising a liquid crystal; and
- at least one pixel,
  wherein said one pixel is provided with complementary transistors comprising an n-channel transistor and a p-channel transistor provided on an inside of one of said substrates;
- an electrode provided on said inside of one of said substrates and connected to one of drain and source terminals of said n-channel transistor and one of drain and source terminals of said p-channel transistor;
- a pair of row control lines one of which is connected to the other one of the drain and source terminals of said n-channel transistor and the other one of which is connected to the other one of the drain and source terminals of said p-channel transistor; and
- a column control line connected to gate terminals of said n-channel transistor and said p-channel transistor.

In the operation of the electro-optical device, an electric signal is applied to said row control lines and an electric signal is applied to said column control line for the duration of the electric signal applied to said row control lines to drive the complementary TFTs. Thus, the pixels constituting the electro-optical device are selectively made to go on or go out.

Other objects and features of the invention will appear in the course of the description thereof which follows.

BRIEF DESCRIPTION OF THE DRAWINGS

FIG. 1 is a circuit diagrams of an active display device using complementary thin film transistors (TFTs) in accordance with the present invention;

FIGS. 13(A) to 13(F) are cross-sectional views illustrating steps for manufacturing complementary TFTs used in a liquid crystal display according to the invention;

DETAILED DESCRIPTION OF THE INVENTION

Figure 2:
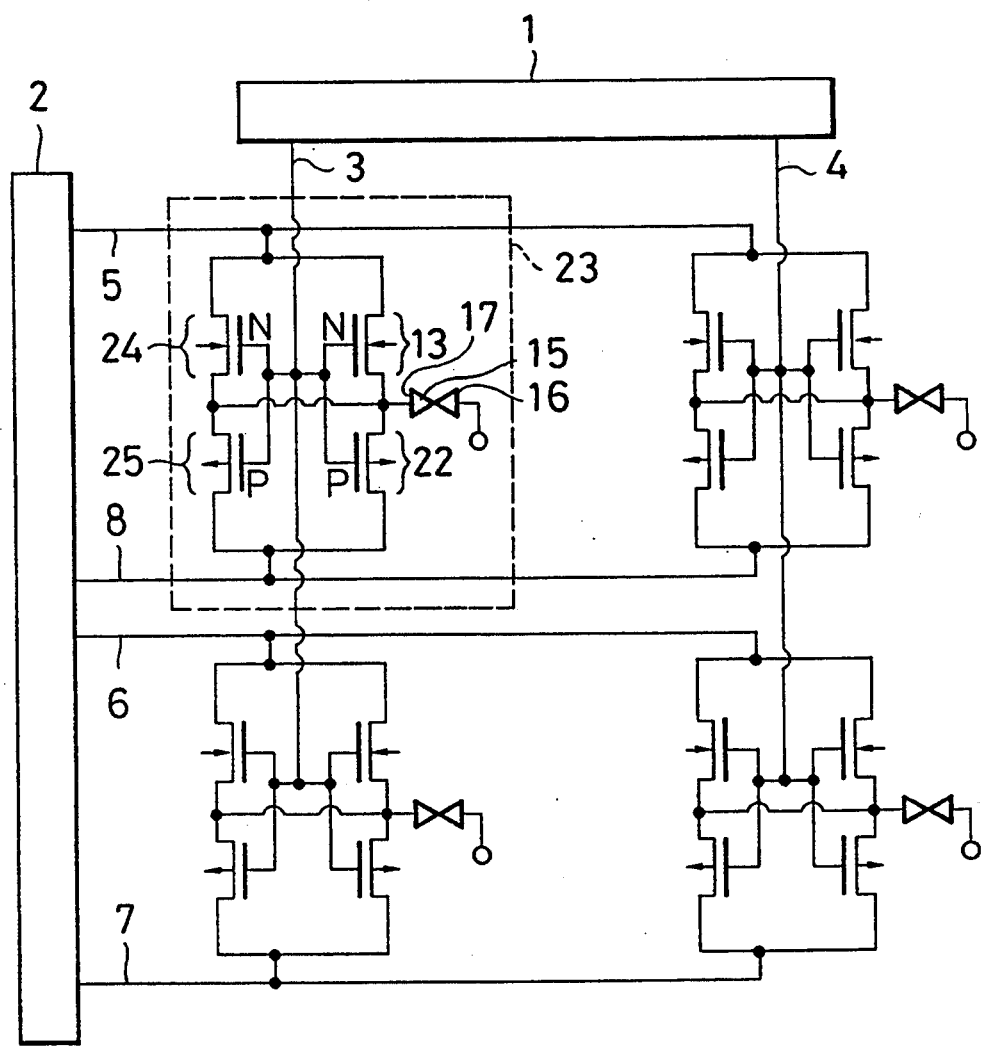
Fig.2 is a circuit diagram of another active display device using complementary thin film transistors (TFTs) in accordance with the present invention.
Figure 3:
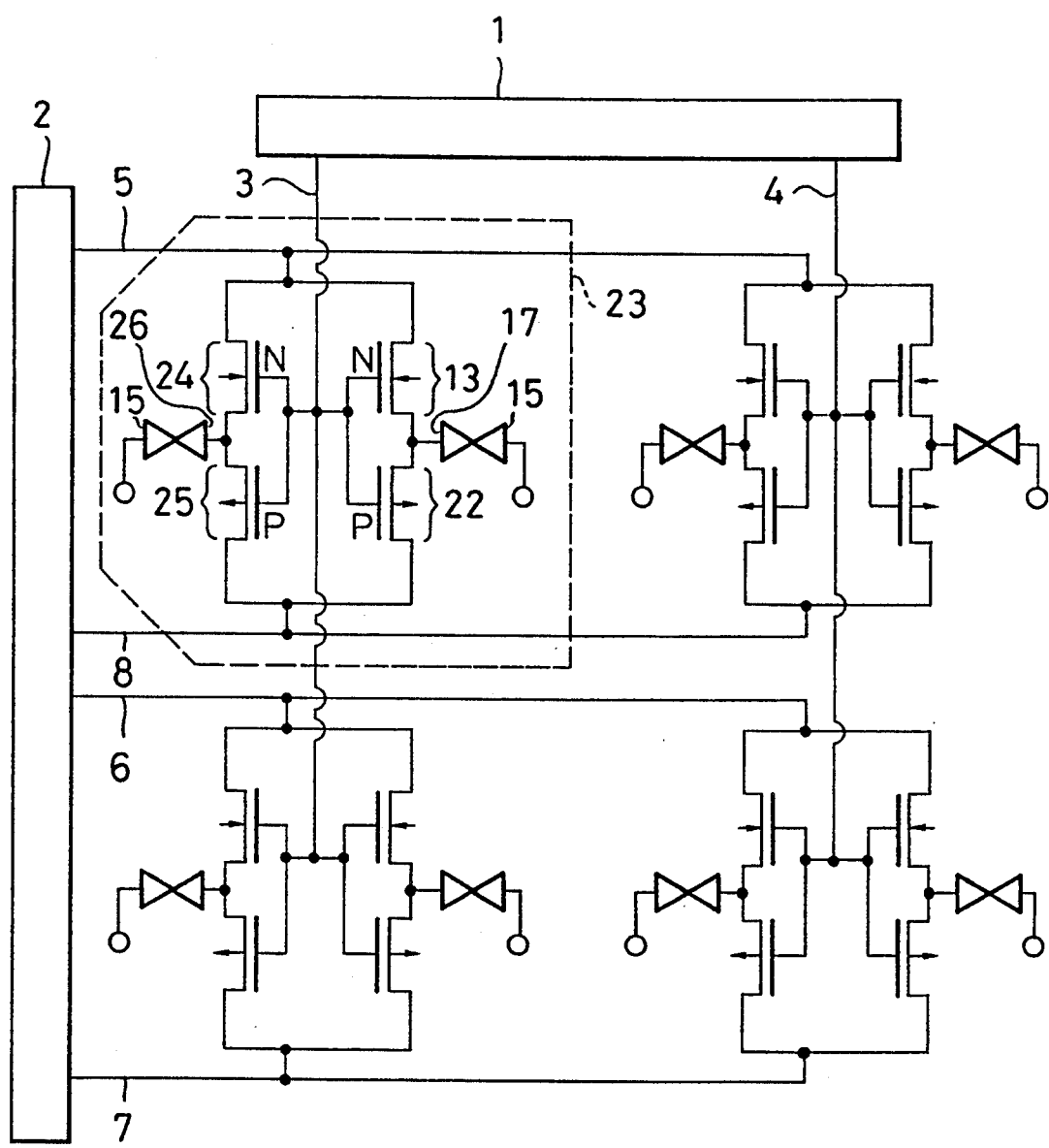
FIG. 3 is a circuit diagram of a further active display device using complementary thin film transistors (TFTs) in accordance with the present invention.
Figure 6:
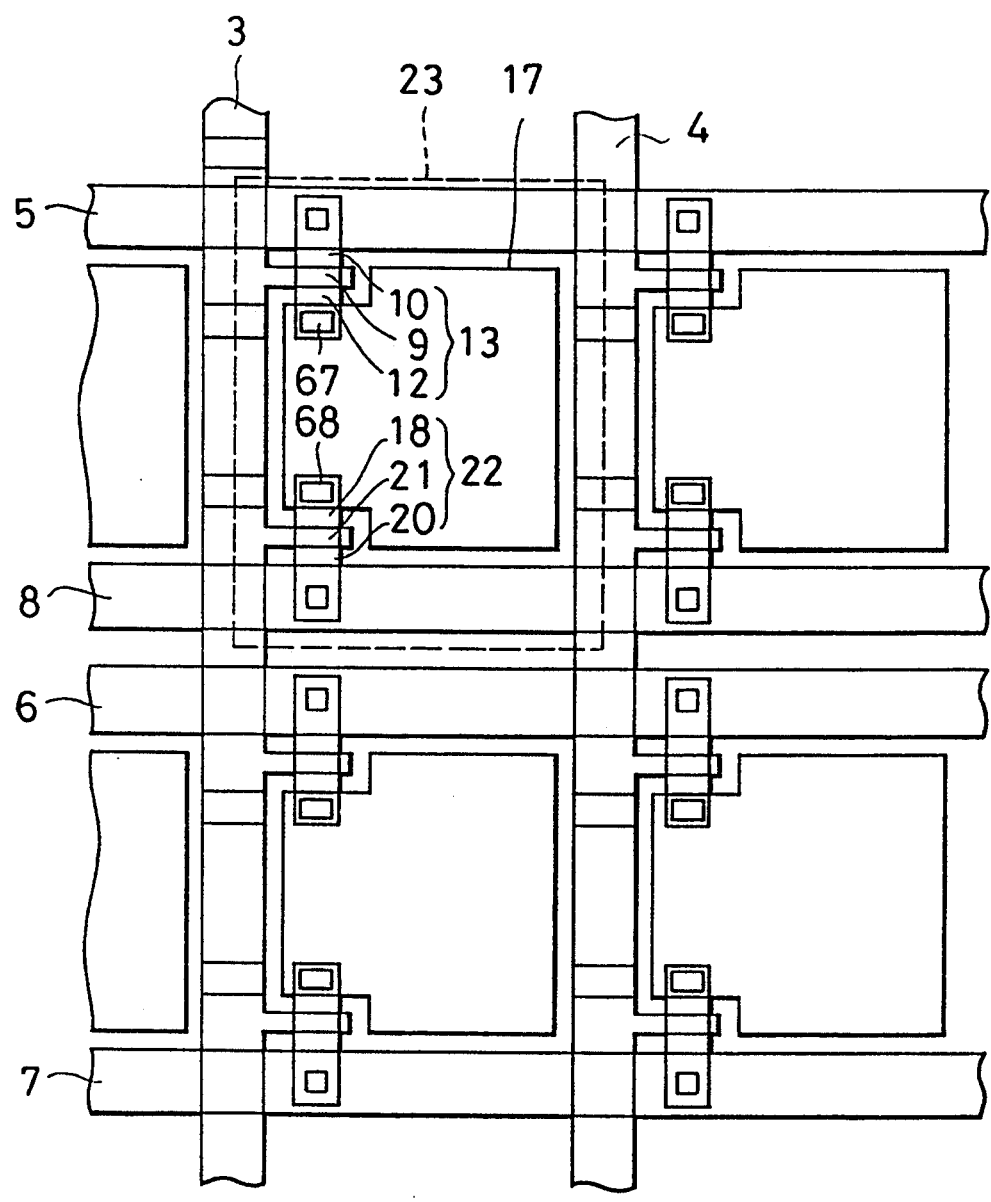
FIG. 6 is a fragmentary plan view of one example of one substrate of the liquid crystal display shown in FIG. 1.
Figure 7:
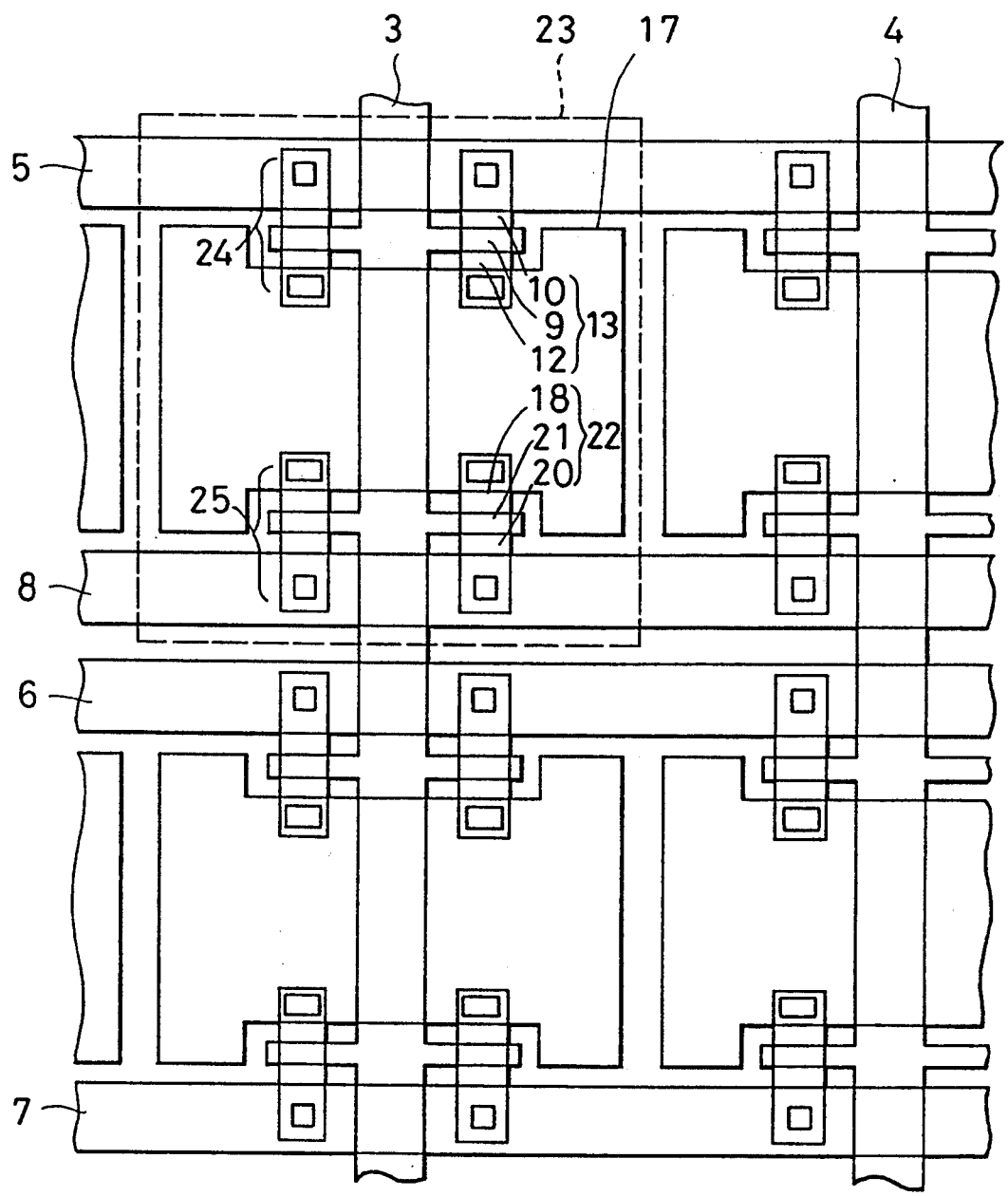
FIG. 7 is a fragmentary plan view of one substrate of the liquid crystal display shown in FIG. 2.
Figure 8:
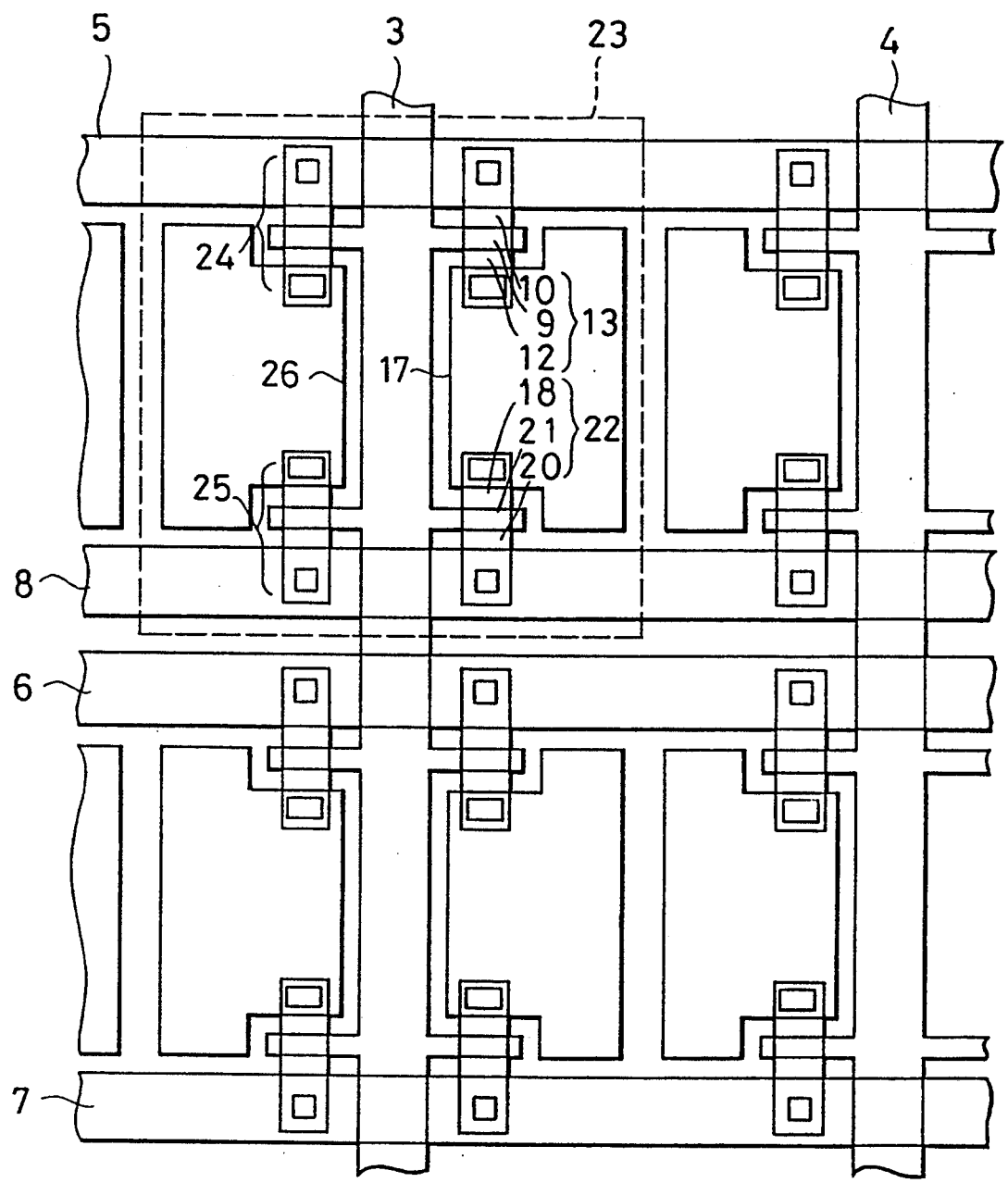
FIG. 8 is a fragmentary plan view of one example of one substrate of the liquid crystal display shown in FIG. 3.

Typical examples of liquid crystal electro-optical device to which the invention can be applied are shown in the circuits diagrams of FIGS. 1, 2, and 3. The layouts of actual patterns of these examples are shown in FIGS. 6, 7, and 8, respectively. To simplify the illustration, we take a matrix of 2×2 as an example. Referring to FIG. 1, the gates of n-channel TFTs (thin film transistors) and of p-channel TFTs are connected to each other. Also, the gate of each TFT is connected to a third signal line 3 or 4 which extends along the Y-axis. The common output terminal of each complementary TFT pair is connected with a liquid crystal 15. The input terminal 10 of each n-channel TFT is connected with a first one 5 or 8 of a pair of corresponding signal lines extending along the X-axis. The input terminal 20 of each p-channel TFT is connected with a second one 8 or 7 of a pair of corresponding signal lines running along the X-axis.

In this structure of FIG. 1, when an ON signal is applied to the third signal line 3 while an ON signal is being applied between the first signal line 5 and the second signal line 8 of the signal line pair, the, liquid-crystal potential ($V_{LC}$) 14 is equal to the voltage $V_{GG}$ minus threshold voltage $V_{th}$ ($V_{GG}$-$V_{th}$), the voltage $V_{GG}$ being applied to the third signal line and the voltage $V_{GG}$-$V_{th}$ being applied to the first signal line. When an OFF signal is applied to the third signal line 3 while an OFF signal is being applied between the first signal line 5 and the second signal line 8, the liquid-crystal potential ($V_{LC}$) 14 is earth potential (ground level). When an ON signal is not applied to the third signal line 3 while an ON signal is being applied between the first signal line 5 and the second signal line 8, the liquid-crystal potential ($V_{LC}$) 14 is similarly null (ground level). In this way, the liquid-crystal potential ($V_{LC}$) 14 is changed in response to the voltage applied to the third signal line 3. The potential difference applied to the liquid crystal can be arbitrarily varied by changing the voltage of the signal applied to this signal line.

An offset voltage (electric potential) $V_{OFFSET}$ is applied to a counter electrode 16. The voltage actually applied to the liquid crystal 15 is $V_{GG}+V_{OFFSET}-V_{th}$ or $V_{OFFSET}$. In the driving method of the invention, the offset voltage $V_{OFFSET}$ applied to the counter electrode is varied to activate and deactivate the liquid crystal at will. The threshold value actually used for activating the liquid crystal differs among liquid crystal materials. It is possible to accommodate any arbitrary threshold value by varying the offset voltage $V_{OFFSET}$ according to the threshold value of the liquid crystal.

When the liquid crystal is driven by supplying a signal thereto, if a large amount of one of positive voltage and negative voltage is applied to the liquid crystal as compared with the other, then electrolysis occurs, attacking or denaturing the liquid crystal material. In consequence, a satisfactory display cannot be provided. In order to solve such a problem, an AC signal is applied. In the novel driving method of the present invention, an AC signal can be very easily produced simply by inverting the polarity of the offset voltage $V_{OFFSET}$ applied to the counter electrode and the logic, i.e., either 1 or 0, of the select signals applied to the data signal lines.

In the example of FIG. 2, an n-channel TFT 13 and a p-channel TFT 22 form a first complementary TFT pair. An n-channel TFT 24 and a p-channel TFT 25 form a second complementary TFT pair. All of the four gate electrodes of these four TFTs are connected to the third signal line 3 extending in the Y-direction. The n-channel TFTs 13 and 24 have a common input terminal which is connected to the first signal line 5 extending in the X-direction. The p-channel TFTs 22 and 25 have a common input terminal that is connected with the second signal line 8 running in the X-direction. These two complementary TFT pairs have a common output terminal connected with a pixel electrode 17 which is disposed on one side of a liquid crystal 15 of a pixel 23. If a slight leakage occurs from one of the two complementary TFT pairs, the pixel electrode can be activated, because they are in phase.

In the example of FIG. 3, two pixel electrodes 17 and 26 and two corresponding complementary TFT pairs are provided for one pixel 23. The two complementary TFT pairs have a common gate electrode to which a first input signal is applied. The input terminals of the n-channel TFTs of the same complementary TFT structure are connected with the first signal line 5, while the input terminals of the p-channel TFTs of the same complementary TFT structure are connected with the second signal line 8. Even if one of two pixel electrodes for one pixel does not operate due to a trouble such as a leakage from any TFT, the other does operate. If the operation of one pair is delayed, the other operates normally and, therefore, the defective location is not noticeable during the operation of the matrix structure.

In the liquid crystal electro-optical devices described above, a dispersion liquid crystal material can be used between the pair of substrates.

In these liquid crystal electro-optical devices, the first and second signal lines forming pairs extend in the X-direction, while the third signal lines run in the Y-direction. Thus, the signal lines are arranged in rows and columns. Complementary thin film transistors and pixel electrodes are formed at the intersections of these signal lines. The source or drain of each n-channel TFT connected with a first pixel electrode is connected with the first signal line of the corresponding signal line pair extending in the X-direction. The source or drain of each p-channel TFT connected with the first pixel electrode is connected with the second signal line of the corresponding signal line pair extending in the X-direction. The source or drain of each p-channel TFT connected with the same third signal line and connected with a second pixel electrode which neighbors the first pixel electrode is connected to the second signal line of other signal line pair extending in the X-direction. The second signal line to which the p-channel TFT for the first pixel electrode is connected is adjacent to the second signal line to which the p-channel TFT for the second pixel electrode is connected. In these display devices, only a small amount of leakage takes place between these two adjacent second signal lines and therefore various kinds of electro-optical modulating layer can be provided between the pair of substrates. The electro-optical modulating layer may comprise a twisted nematic liquid crystal, a ferroelectric liquid crystal, a dispersion liquid crystal, or a polymeric liquid crystal. The amount of leakage can be reduced, irrespective of the kind of the material used in the electro-optical modulating layer.

As described above, the signal lines for the p-channel TFTs for adjacent pixels are made to neighbor each other. It is also possible that the signal lines for the n-channel TFTs for adjacent pixels neighbor each other.

Figure 16:
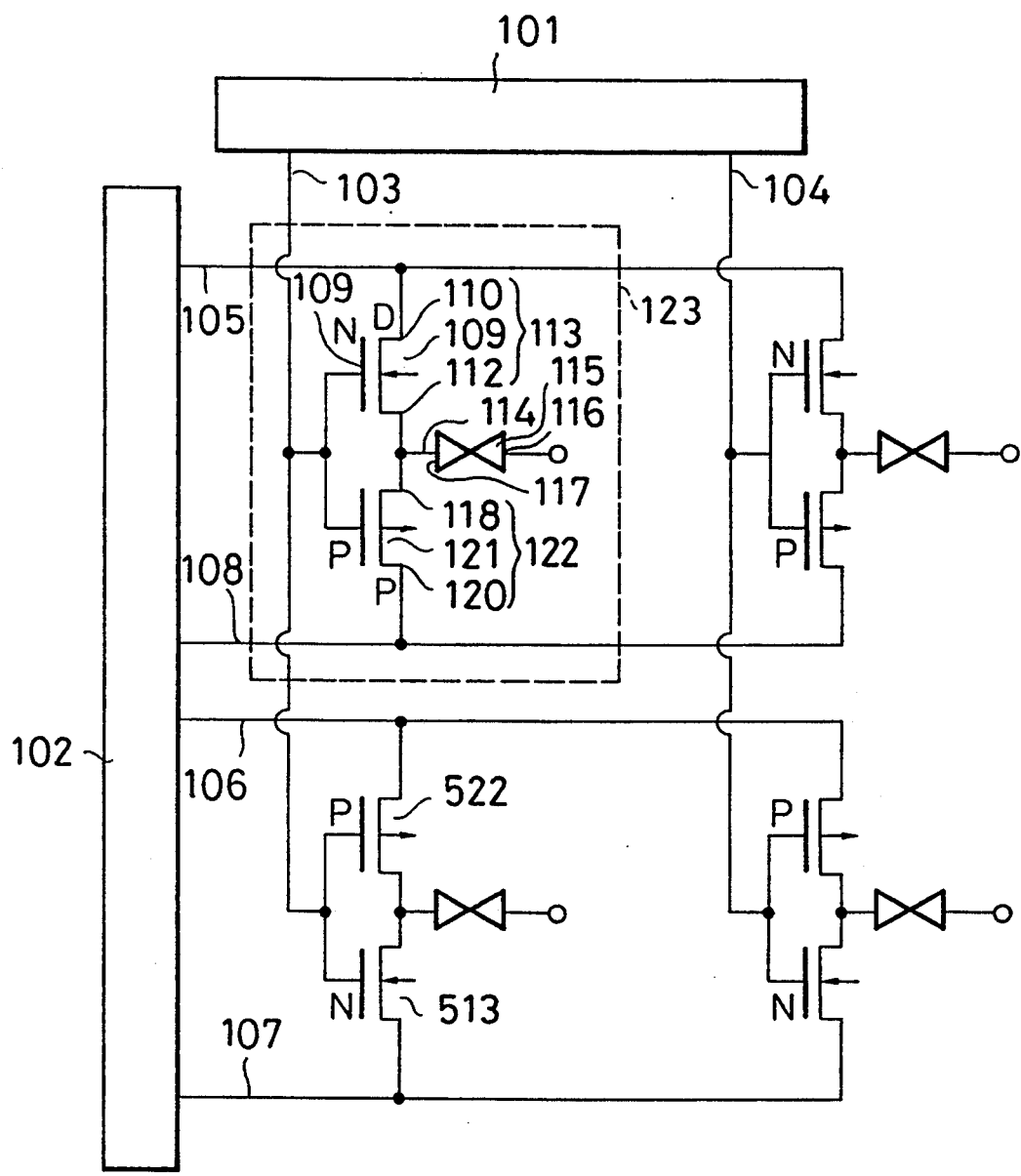
FIG. 16 is a circuits, diagram of an active display device using complementary TFTs according to the invention.
Figure 17:
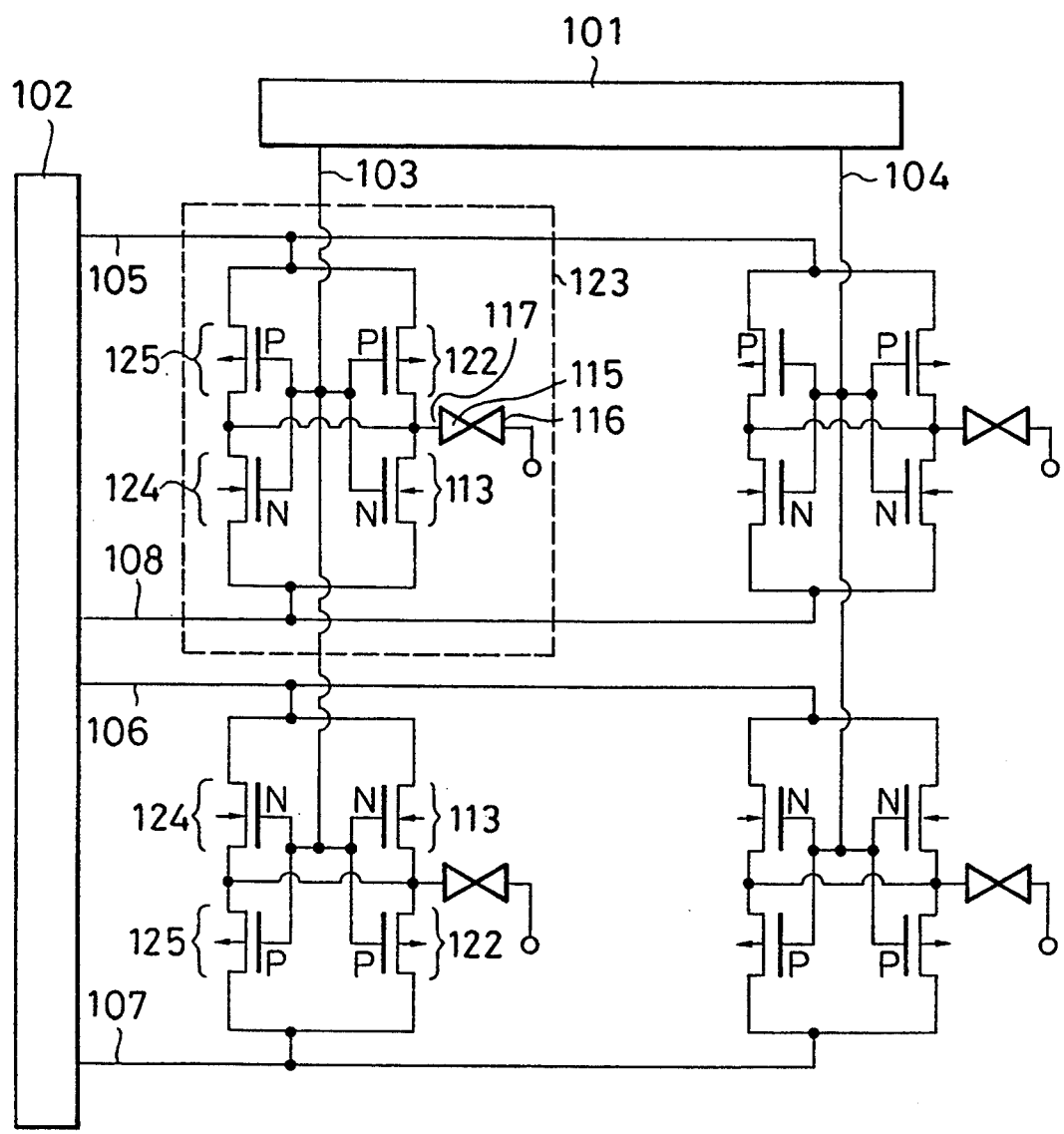
FIG. 17 is a circuit diagram of an active display device using complementary TFTs according to the invention.
Figure 19:
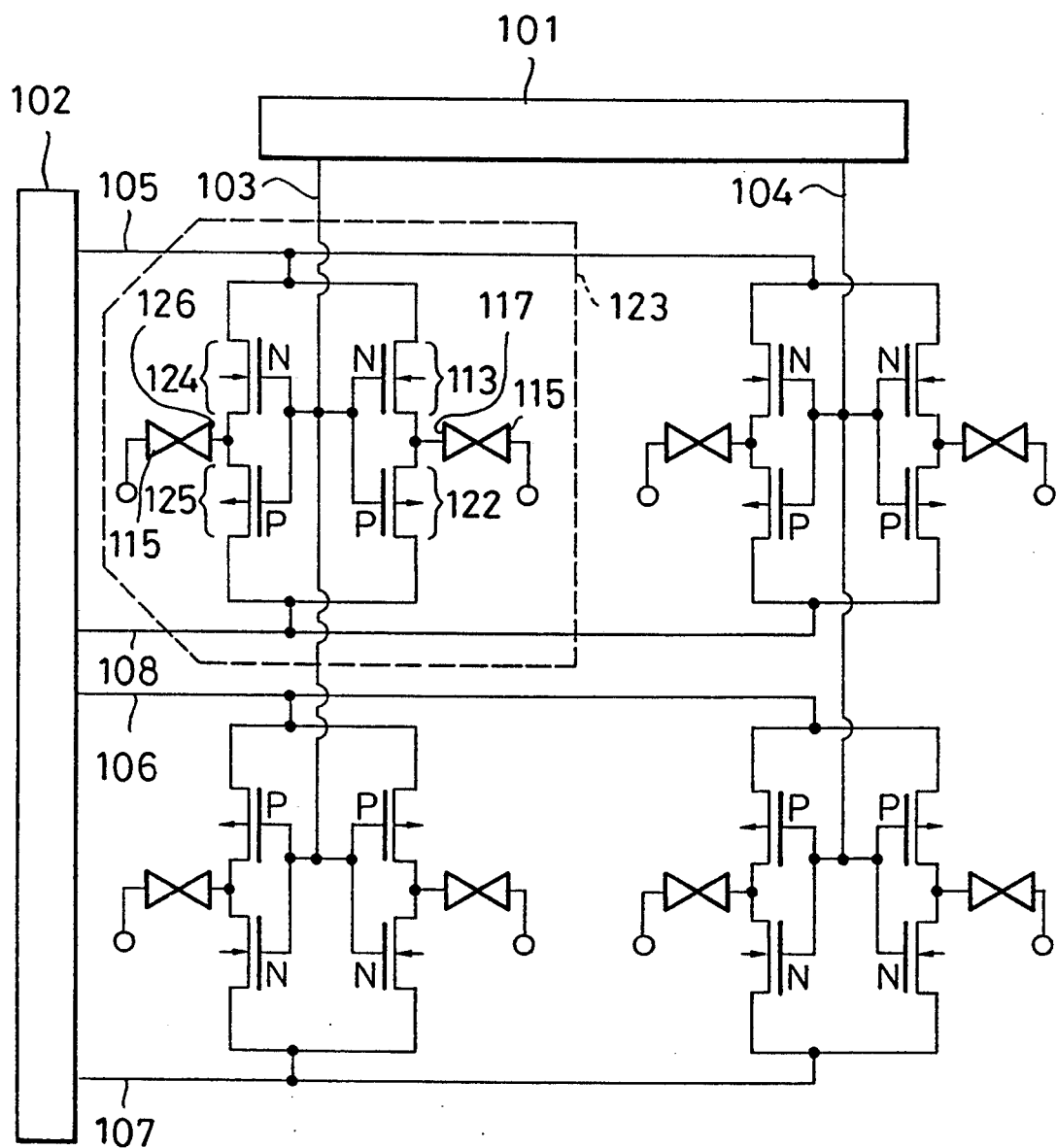
FIG. 19 is a circuit diagram of an active display device using complementary TFTs according to the invention.
Figure 20:
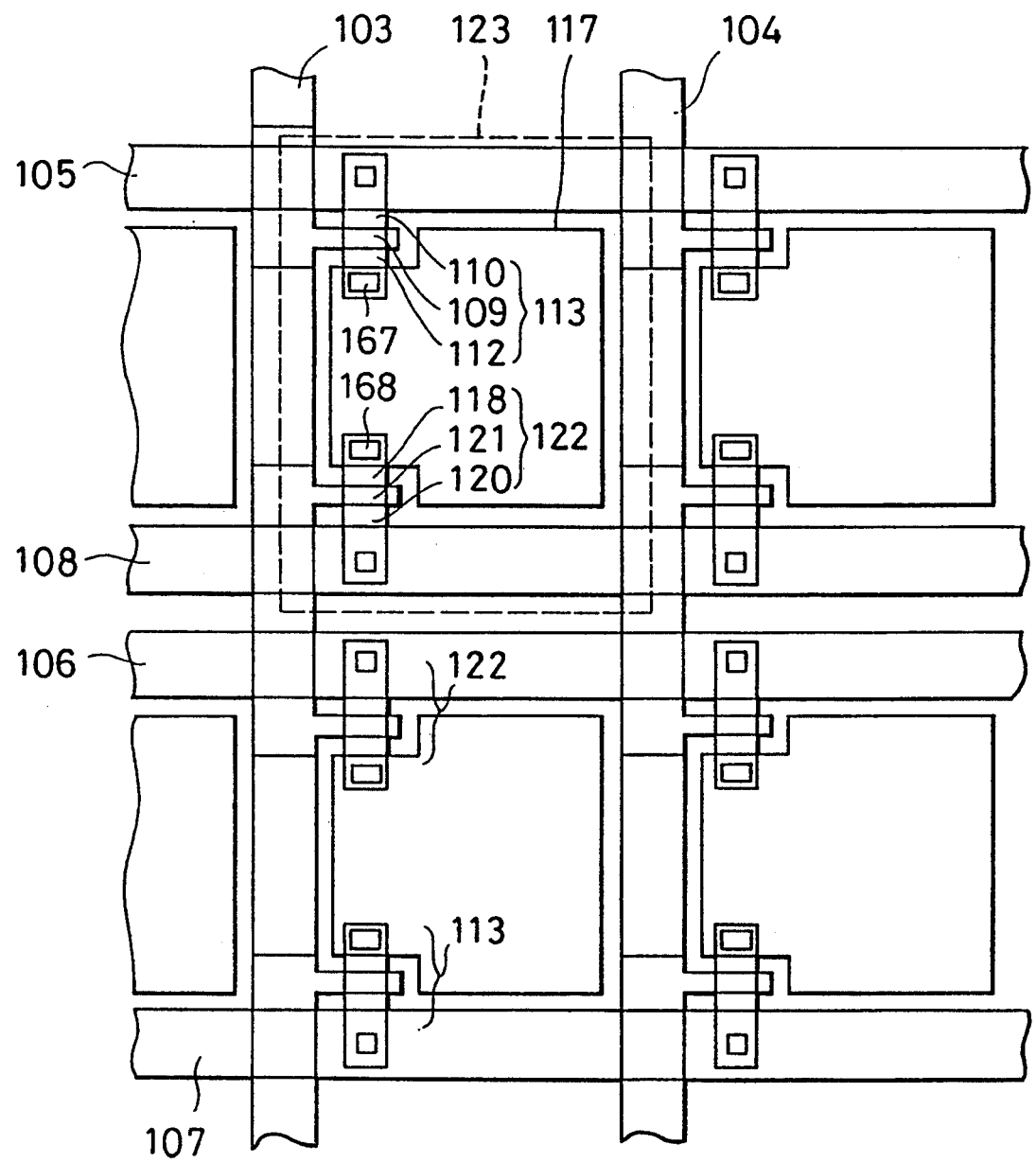
FIG. 20 is a fragmentary plan view of another example of one substrate of the liquid crystal display shown in FIG. 1.
Figure 21:
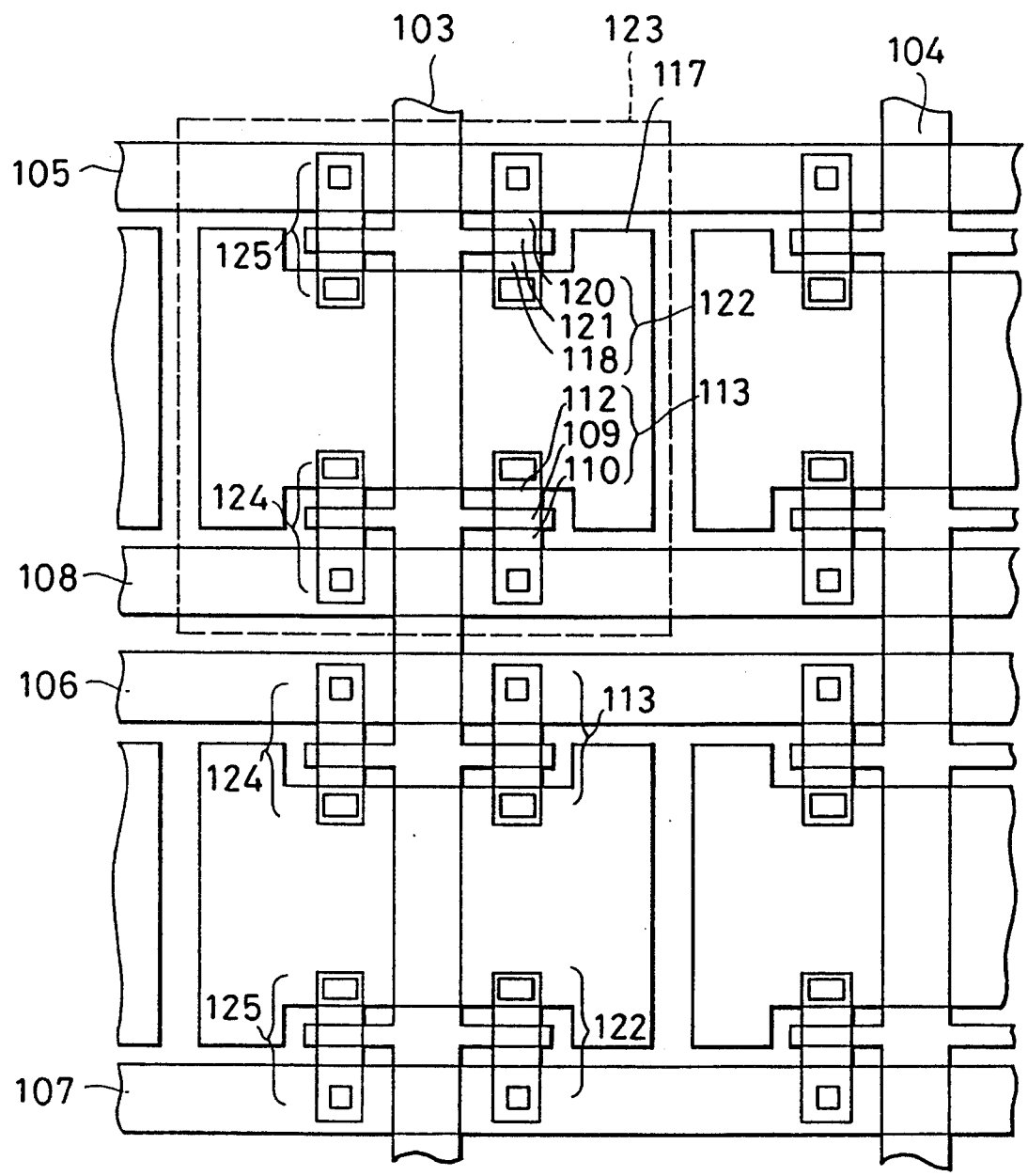
FIG. 21 is a fragmentary plan view of one substrate of a liquid crystal display according to the invention.
Figure 22:
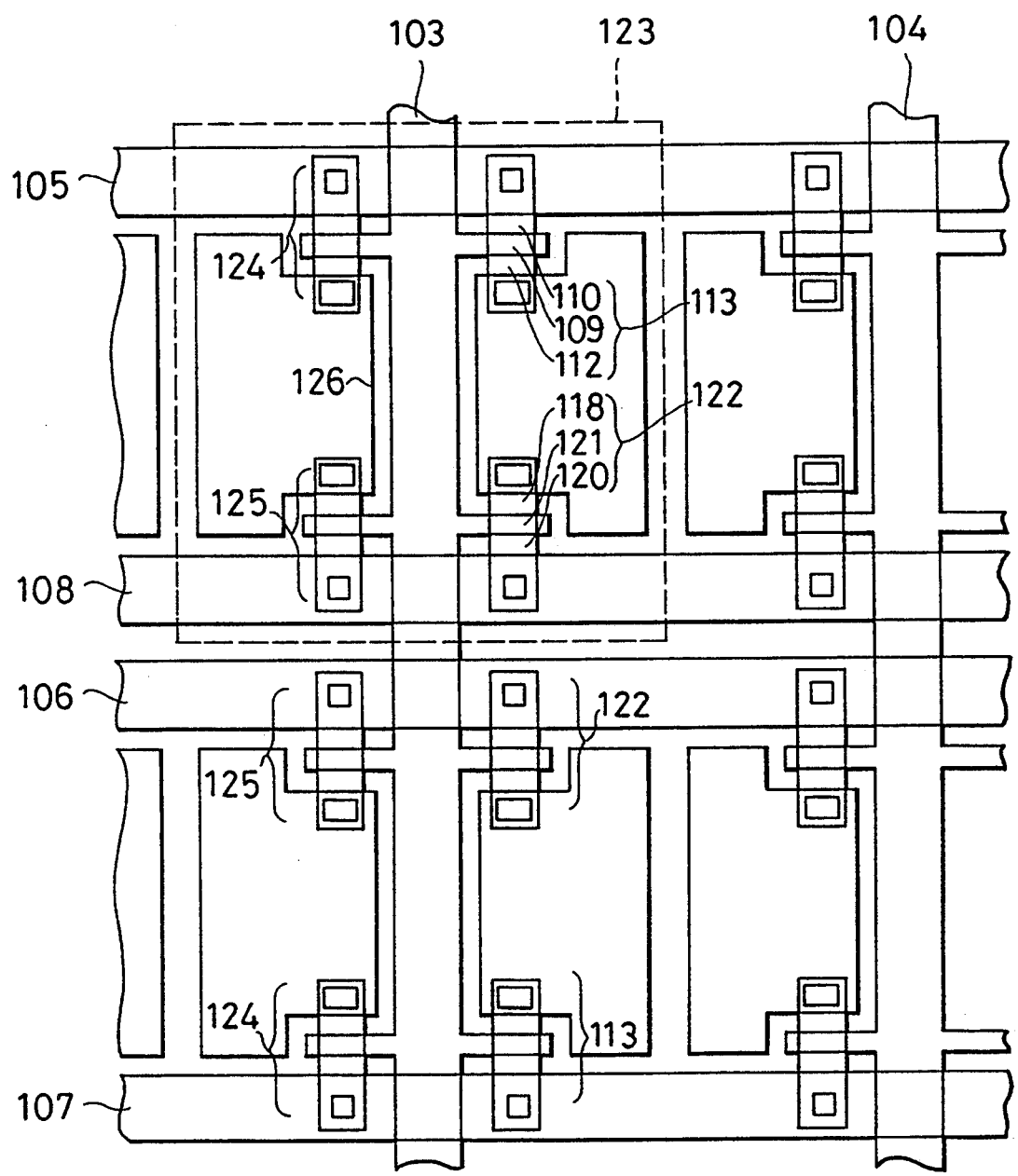
FIG. 22 is a fragmentary plan view of one substrate of a liquid crystal display according to the invention.

Typical examples of liquid crystal electro-optical device to which the present invention can be applied are shown in the circuit diagrams of FIGS. 16, 17, and 19. The layouts of examples of their respective actual patterns are shown in FIGS. 20, 21, and 22, respectively. To simplify the illustration, we take a matrix of 2×2 as an example. In the example of matrix of 2×2 shown in FIG. 16, the gates of n-channel and p-channel TFTs are connected to each other and also to a third signal line 103 or 104 extending in the Y-direction. Each complementary TFT pair has a common output terminal which is connected with a liquid crystal 115. The input terminal 110 of each n-channel TFT is connected to the first signal line 105 or 107 of a signal line pair extending in the X-direction. The input terminal 120 of each p-channel TFT is connected to the second signal line 108 or 106 of a signal line pair running in the X-direction.

Figure 4:
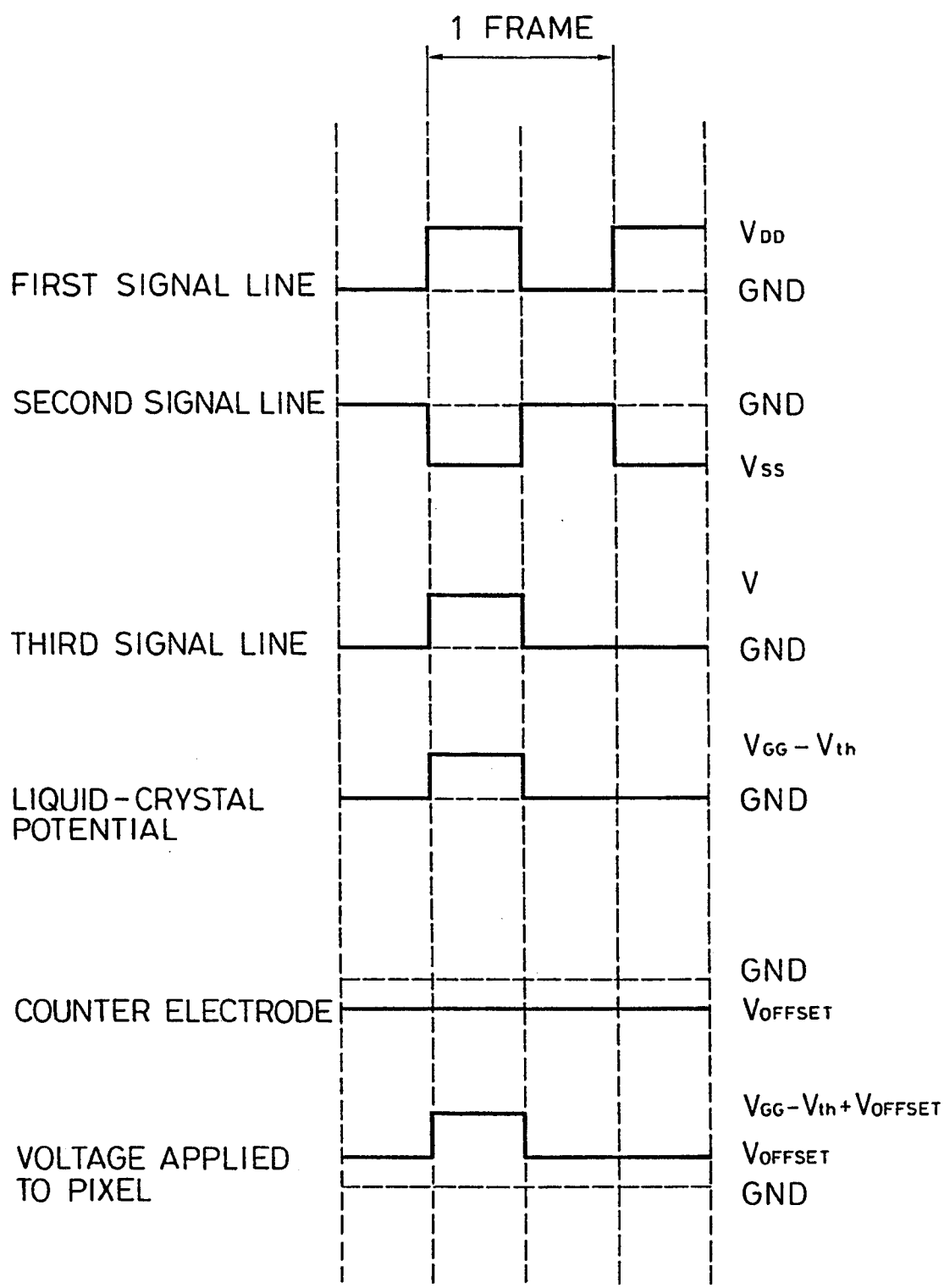
FIG. 4 is a waveform diagram of signals for activating active display devices according to the invention.
Figure 5:
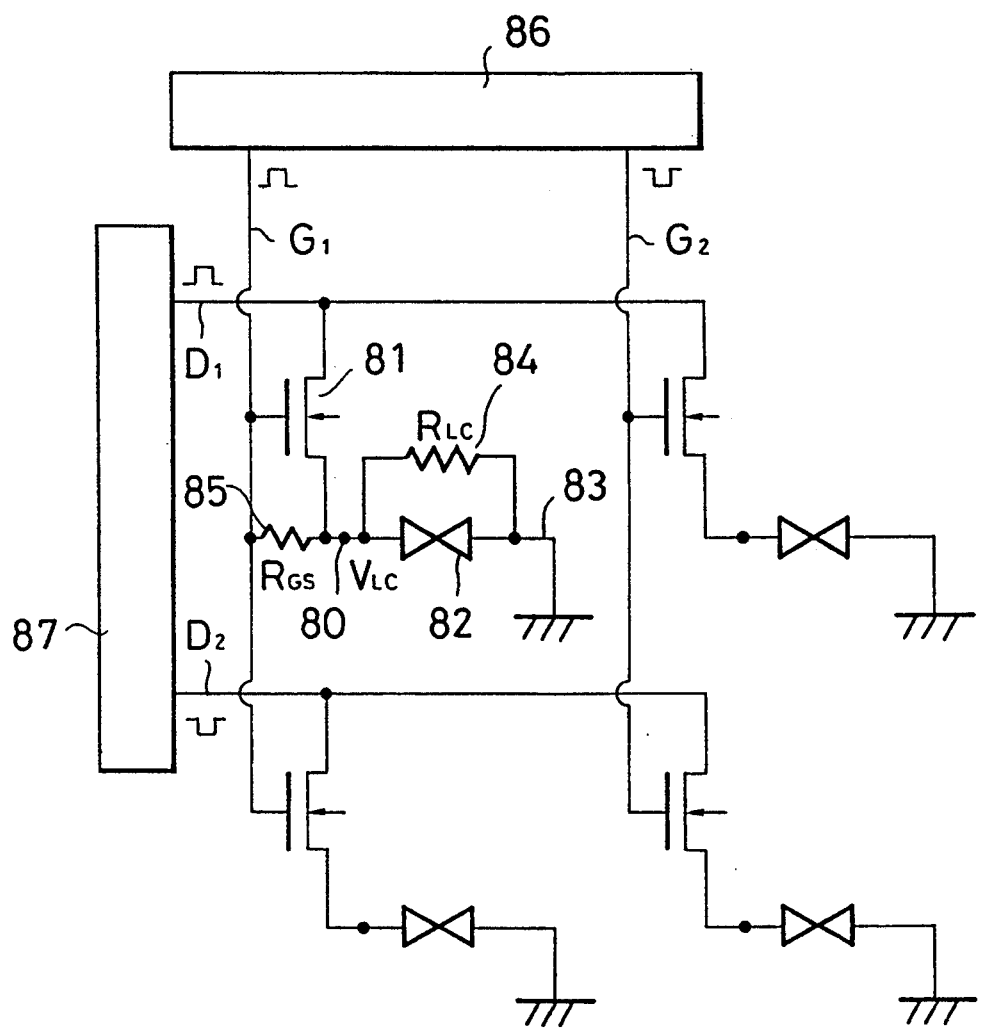
FIG. 5 is a circuit diagram of the prior art active liquid crystal device.

In this structure, as shown in FIG. 4, an ON signal is applied to the third signal line 103 while an ON signal is being applied between the first signal line 105 and the second signal line 108 forming a pair. At this time, the liquid-crystal potential ($V_{LC}$) 114 is equal to $V_{GG}$-$V_{th}$, the voltage $V_{GG}$ being applied to the third signal line 103 and the voltage $V_{GG}$-$V_{th}$ being applied to the first signal line 105. When an OFF signal is applied to the third signal line 103 while an OFF signal is being applied between the first signal line 105 and the second signal line 108 of the pair, the liquid-crystal potential ($V_{LC}$) 114 is null (ground level). Also, when an ON signal is not applied to the third signal line 103 while an ON signal is being applied between the first signal line 105 and the second signal line 108, the liquid-crystal potential ($V_{LC}$) 114 is null (ground level). In this way, the liquid-crystal potential ($V_{LC}$) 114 is varied, depending on the voltage applied to the third signal line. The potential difference applied to the liquid crystal can be arbitrarily changed by varying the voltage of the signal applied to this signal line.

An offset voltage $V_{OFFSET}$ is applied to a counter electrode 116. The voltage actually applied to the liquid crystal 115 is $V_{GG}+V_{OFFSET}-V_{th}$ or $V_{OFFSET}$.

In the devices shown in FIGS. 1, 2, and 3, the signal line 8 of the p-channel TFT for one pixel is adjacent to the signal line 6 of the n-channel TFT for the adjacent pixel. When an input signal $V_{DD}$ or $V_{SS}$ is applied, the maximum value of the voltage applied between the signal lines 6 and 8 is $2V_{DD}$ or $2V_{SS}$. However, in the devices shown in FIGS. 16, 17, and 19, the adjacent signal lines 108 and 106 are connected either to the p-channel TFTs or to the n-channel TFTs. In this case, the maximum value of the voltage applied between the signal lines 108 and 106 is only $V_{DD}$ or $V_{SS}$. Therefore, the amount of leakage between the signal lines 108 and 106 is small.

For example, in the case where an ON signal is applied between the first signal line 105 and the second signal line 108 and an OFF signal is applied between the signal line 106 and the signal line 107 for the duration of the ON signal, only a potential difference of $V_{SS}$ or $V_{DD}$ is applied between the signal lines 108 and 106. This potential difference is half the potential difference applied in the cases of FIGS. 1 to 3. Hence, the amount of leakage between these signal lines is reduced. The spacing between the signal lines can be halved if the same amount of leakage is tolerated.

In the example of FIG. 17, an n-channel TFT 113 and a p-channel TFT 122 form a first complementary TFT pair. An n-channel TFT 124 and a p-channel TFT 125 form a second complementary TFT pair. All of the four gate electrodes of these four TFTs are connected to the third signal line 103. The n-channel TFTs 113 and 124 have a common input terminal which is connected to the second signal line 108 extending in the X-direction. The p-channel TFTs 122 and 125 have a common input terminal connected with a first signal line 105 extending in the X-direction. These two complementary TFT pairs have a common output terminal connected with a pixel electrode 117 which is located on one side of a liquid crystal 115 of a pixel 123. If a slight leakage occurs from one of the two complementary TFT pairs, the pixel electrode can be activated, because they are in phase.

In the example of FIG. 19, two pixel electrodes 117 and 126 and two corresponding complementary TFT pairs are provided for one pixel 123. The two complementary TFT pairs have a common gate electrode to which a first input signal is applied. The input terminals of the two complementary TFT pairs are connected with the first signal line 105 or with the second signal line 108. If one of two TFT pairs for one pixel does not operate due to a trouble such as a leakage from any TFT, the other does operate. If the operation of one pair is delayed, the other operates normally and, therefore, the defective location is not noticeable during the operation of the matrix structure.

In a liquid crystal electro-optical device to which the present invention is applicable, two or more complementary TFT pairs can be provided for one pixel. Furthermore, one pixel may be divided into two or more parts. One or more complementary TFT pairs may be connected to each part.

Dispersion liquid crystal materials used in the present invention comprise transparent substances in solid phase, such as transparent polymers in solid phase and monomers forming high molecules, and nematic, cholesteric, or smectic liquid crystals dispersed in the transparent substances in a granule or spongy state. Examples of the transparent polymers in solid phase include polyethylene, polymethacrylic acid ester, polystyrene, polyvinyl chloride, polyacrylonitrile, polyvinyl alcohol, polyester, polyamide resin, polyethylene terephthalate resin, fluorocarbon resins, and silicone resins. These are used alone or in combination.

A dispersion liquid crystal is prepared by dissolving in a solvent either a mixture of a monomer forming a high molecule and a liquid crystal material or a mixture of a polymer in solid phase as mentioned above and a liquid crystal material. Where the former mixture is employed, it is applied to a substrate and then it is heated or exposed to light to form an electro-optical modulating layer. Where the latter mixture is used, it is dissolved in the solvent, thus producing a liquid. This liquid is applied to a substrate to form a liquid medium layer. Subsequently, this solvent is removed. As a result, a dispersion liquid crystal is obtained.

Examples of the usable solvent include ketones, alcohols, benzene, toluene, and other unsaturated hydrocarbons, and water. One or more solvents are selected appropriately according to the application method. One solvent can be used alone. Also, a mixture of plural solvents can be used. The used method of application is selected according to the shape and the characteristics of the liquid crystal material. A doctor knife, a roll coater, a curtain coater, a knife coater, spraying, spin coating, screen printing, offset printing, and other means can be adopted.

EXAMPLE 1

Figure 10:
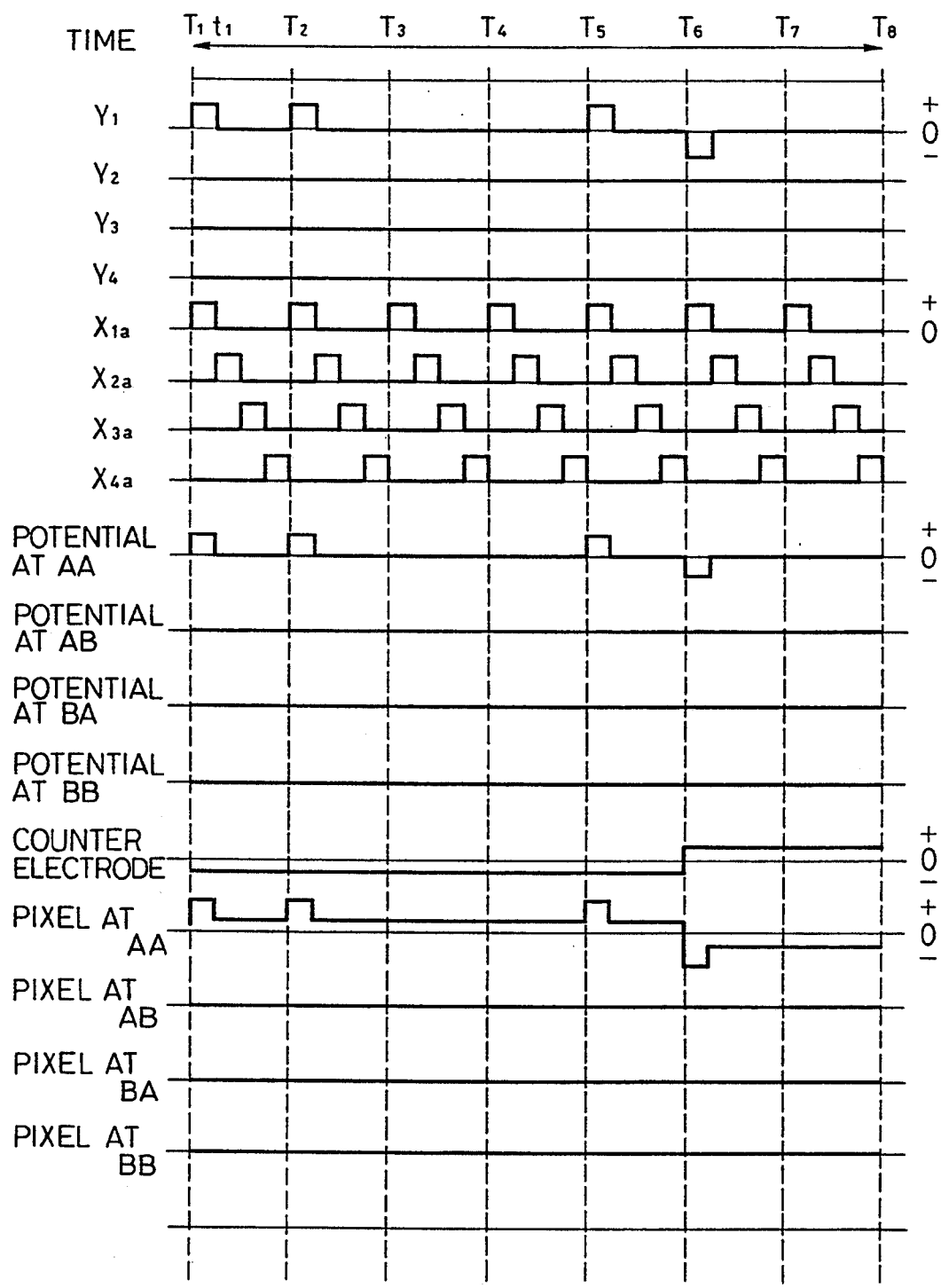
FIG. 10 is a timing chart of the waveforms of signals for driving liquid crystal displays according to the invention.

A liquid crystal display of the circuit configuration of FIG. 1 was used. The arrangement of electrodes and other components corresponding to this circuit configuration is shown in FIG. 6. To simplify the illustration, only the portion which corresponds to a matrix portion of 2×2 is shown. The waveforms of the signals actually used to activate the device are shown in FIG. 10. To simplify the illustration again, signal waveforms used to drive a matrix of 4×4 are next described.

Figure 13E:
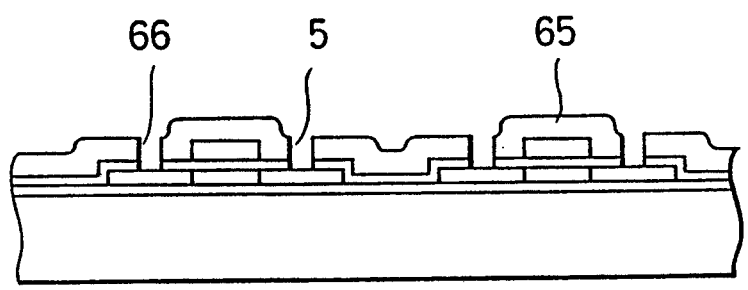

The manner in which the liquid crystal display was fabricated is now described by referring to FIGS. 13(A) to 13(F). In FIG. 13(A), a plate of inexpensive glass 50 withstanding thermal treatment below 700° C., for example, at about 600° C., was prepared. Silicon oxide was sputtered as a 1000 to 3000 Å thick film on the glass 50 by RF (high frequency) sputtering, using a magnetron. In this way, a blocking layer 51 was formed. The atmosphere consisted of 100% oxygen. The film was formed at a temperature of 15° C. The output of the magnetron was 400 to 800 W. The pressure was 0.5 Pa. A target consisting of quartz or a single crystal of silicon was used. The silicon oxide was sputtered at a rate of 30 to 100 Å/min.

A film of silicon was formed on this blocking layer 51 by low-pressure chemical vapor deposition (LPCVD), sputtering, or plasma CVD. Where the film was formed by low-pressure chemical vapor deposition, disilane ($Si_2H_6$) or trisilane ($Si_3H_8$) was supplied to a CVD apparatus at a temperature lower than the crystallization temperature by 100° to 200° C., i.e., at 450° to 550° C., for example, 530° C., to create the film. The pressure inside the reaction furnace was 30 to 300 Pa. The film was formed at a rate of 50 to 250 Å/min. In order to make the threshold voltage ($V_{th}$) for n-channel TFTs substantially equal to the threshold voltage ($V_{th}$) for p-channel TFTs, boron in the form of diborane could be introduced into the film at $1 \times 10^{15}$ to $1 \times 10^{18}$ cm$^{-3}$ during the film formation.

Where sputtering was used, the back pressure prior to the sputtering was $1 \times 10^{-5}$ Pa or less. A single crystal of silicon was used as a target. The process was carried out within an atmosphere of argon to which 20 to 80% hydrogen was added. For instance, argon and hydrogen accounted for 20% and 80%, respectively. The film was formed at a temperature of 150° C. The frequency was 13.56 MHz. The sputtering output was 400 to 800 W. The pressure was 0.5 Pa.

Where a silicon film was formed by plasma CVD, silane ($SiH_4$) or disilane ($Si_2H_6$) was used at a temperature of, for example, 300° C. The material was admitted into a PCVD apparatus and the film was formed by applying an RF power of 13.56 MHz.

The film formed by these methods preferably contains oxygen atoms of $5 \times 10^{21}$ atoms·cm$^{-3}$. If this oxygen concentration is high, crystallization does not easily take place. Therefore, the annealing temperature or the annealing time must be increased. If the oxygen concentration is too low, then the leakage current in OFF state will be increased by backlighting. For these reasons, the preferable range is between $4 \times 10^{19}$ and $4 \times 10^{21}$ atoms·cm$^{-3}$. The hydrogen concentration is for example $4 \times 10^{20}$ atoms·cm$^{-3}$. Compared with the amount of the silicon concentration of $4 \times 10^{22}$ atoms·cm$^{-3}$, the hydrogen is 1 atomic %. In order to promote the crystallization at the sources and drains, the oxygen concentration is $7 \times 10^{19}$ atoms·cm$^{-3}$ or less, preferably $1 \times 10^{19}$ atoms·cm$^{-3}$ or less. Ions of oxygen may be implanted only into the regions which become channels of TFTs forming pixels at $5 \times 10^{20}$ to $5 \times 10^{21}$ atoms·cm$^{-3}$. At this time, those TFTs which form peripheral circuits are not illuminated with light. Therefore, reducing the oxygen concentration for obtaining a larger carrier mobility is effective in permitting operation at high frequencies.

After an amorphous silicon film 500 to 5000 Å thick, e.g., 1500 Å, was formed, it was heated at a moderate temperature of 450° to 700° C. for 12 to 70 hours within a non-oxidizing atmosphere. For example, it was allowed to stand at 600° C. within an atmosphere of hydrogen. Since the amorphous silicon oxide film was formed on the surface of the substrate and under the silicon film, no specific nuclei existed during the thermal treatment; rather the whole laminate was uniformly annealed. That is, when the film was created, it had an amorphous structure. The hydrogen was merely added to it.

The silicon film is changed from the amorphous structure to a highly oriented state by the annealing. Some of the film assumes a crystalline state. Especially, after the silicon film is formed, the relatively highly oriented zones tend to crystallize. However, these zones are bonded to each other by the intervening silicon atoms. Therefore, the silicon atoms attract each other. A peak shifted from a single crystal silicon peak of 522 cm$^{-1}$ toward lower frequencies is observed by laser Raman spectroscopy. When calculated from the half-value width, the apparent particle diameter is 50 to 500 Å, which means a micro-crystal. In practice, however, there are numerous highly crystalline zones which form clusters. In this way, a semi-amorphous film can be formed in which the clusters are anchored to each other by silicon atoms.

Consequently, the film is substantially free of grain boundaries. Because carriers can easily move from cluster to cluster through the anchored locations, the carrier mobility is higher than the carrier mobility in polycrystalline silicon where clear grain boundaries exist. That is, the hole mobility ($\mu h$) = 10 to 200 cm$^2$/V·s. The electron mobility ($\mu e$) = 15 to 300 cm$^2$/V·s.

On the other hand, where the film is made polycrystalline by annealing at a high temperature of 900° to 1200° C. not at a moderate temperature as described above, impurities segregate by solid-phase growth from nuclei, so that impurities such as oxygen, carbon, and nitrogen are collected in quantity at the grain boundaries. Although the mobility in the crystal is large, barriers are created at the grain boundaries. Thus, movement of carries is hindered. The actual situation is that it is difficult to obtain mobilities greater than 10 cm$^2$/V·s. In the present example, semi-amorphous or semi-crystal semiconductors are used for these reasons.

In FIG. 13(A), a silicon film was etched photolithographically, using a first photomask (1). A region 22 having a channel width of 20 μm and becoming a p-channel TFT was formed to the right in the figure. A region 13 becoming an n-channel TFT was formed to the left.

A silicon oxide film was formed on this silicon film as a gate-insulating film having a thickness of 500 to 2000 Å, e.g., 1000 Å. This silicon oxide film was created under the same conditions as in the process for fabricating the silicon oxide film acting as the blocking layer. A small amount of fluorine could be doped into the silicon oxide film to fix sodium ions.

Thereafter, a silicon film or a multilayer film including this silicon film was formed on the silicon oxide film. The silicon film was doped with phosphorus at 1 to $5 \times 10^{21}$ atoms·cm$^{-3}$. The multilayer film comprised the silicon film and an overlying film of molybdenum, tungsten, $MoSi_2$, or $WSi_2$. This silicon or multilayer film was patterned, using a second photomask (2). As a result, a laminate shown in FIG. 13(B) was derived. Gate electrodes 55 and 56 for p-channel and n-channel TFTs, respectively, were formed. For example, the channel length was 10 μm. To form the gate electrodes, phosphorus-doped silicon was deposited to a thickness of 0.2 μm and then molybdenum was deposited on it to a thickness of 0.3 μm. In FIG. 13(C), a photoresist 57 was formed, using a photomask (3). Ions of boron were implanted into the source 59 and the drain 58 of the p-channel TFT at a dose of 1 to $5 \times 10^{15}$ cm$^{-2}$. As shown in FIG. 13(D), a photoresist 61 was formed, using a photomask (4). Ions of phosphorous were lodged into the source 64 and the drain 62 of the n-channel TFT at a dose of 1 to $5 \times 10^{15}$ cm$^{-2}$.

These ions were implanted through a gate-insulating film 54. In FIG. 13(B), it is also possible that the silicon oxide on the silicon film is removed, using the gate electrodes 55 and 56 as masks and then ions of boron and phosphorus are implanted directly into the silicon film.

Then, annealing was again effected at 600° C. for 10 to 50 hours. The dopant in the source 59 and drain 58 of the p-channel TFT was activated so that the TFT may be doped p+—type. Also, the dopant in the source 64 and drain 62 of the n-channel TFT was activated so that the TFT may be doped n+—type. Regions 60 and 63 forming channels were formed as semi-amorphous semiconductors under the gate electrodes 55 and 56.

Thus, complementary TFTs could be fabricated without elevating the temperature above 700° C. in any step, though self-aligned ion implantation was utilized. Therefore, it is not necessary to fabricate the substrates from an expensive material such as quartz. In this way, this process is quite suitable for fabrication of a liquid crystal display having a large number of pixels.

In the present example, the annealing step was carried out twice as shown in FIGS. 13(A) and 13(D). Depending on the desired characteristics, the annealing step of FIG. 13(A) can be omitted. In this case, the two annealing steps are carried out simultaneously in the step of FIG. 13(D). As a result, the manufacturing time is shortened. In Fig. 13(E), an interlayer insulator 65 was sputtered to form a silicon oxide film, This film can be created by LPCVD, photo-assisted CVD, or atmospheric pressure CVD. For example, the thickness is 0.2 to 0.6 μm. Then, windows (openings) 66 for electrodes were formed, using a photomask (5). Aluminum was sputtered on the whole laminate. Leads 71, 72 and contacts 67, 68 were fabricated, using a photomask (6). Subsequently, a planarizing organic resin 69, such as transparent polyimide resin, was applied to the surface. Again, holes (openings) were formed for electrodes, using a photomask (7).

Figure 13F:
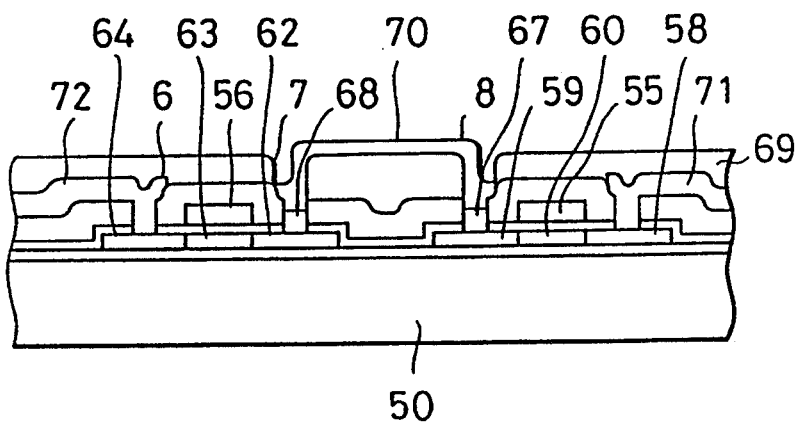
Figure 14:
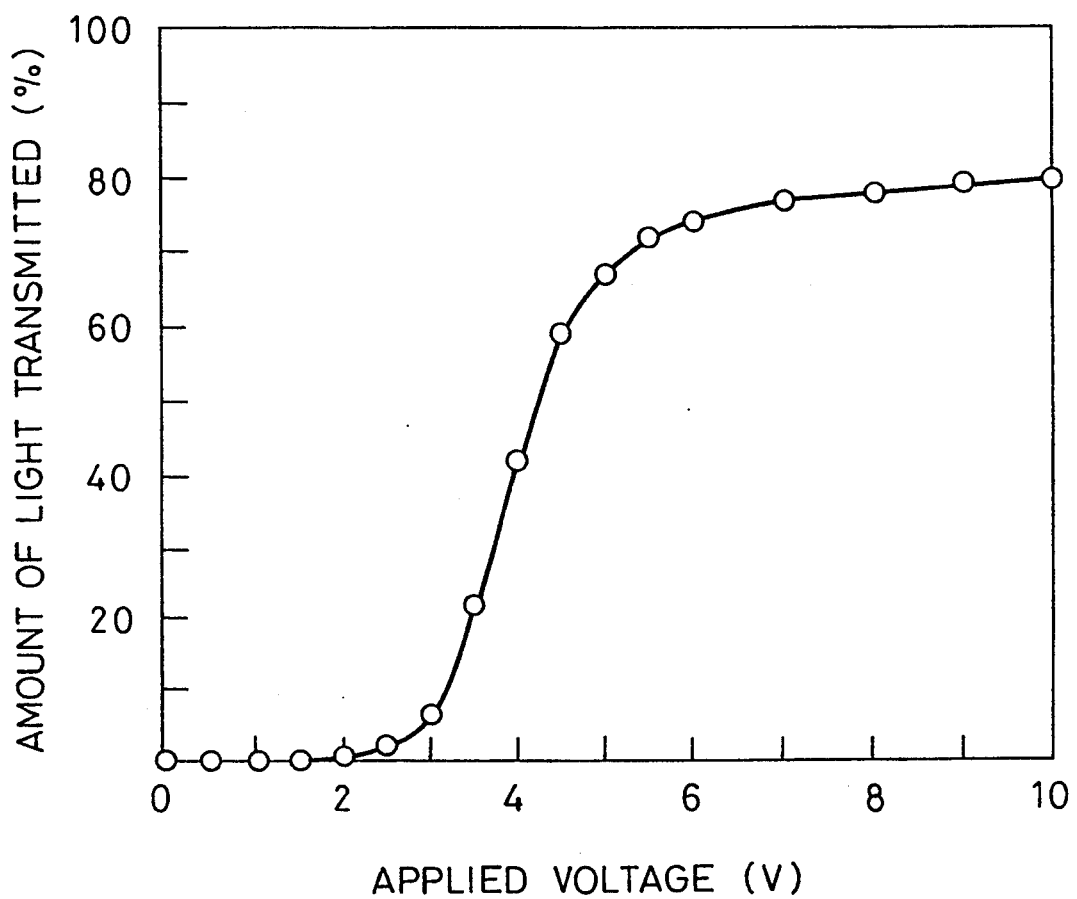
FIG. 14 is a graph showing the electro-optical characteristic of the prior art dispersion liquid crystal.
Figure 15:
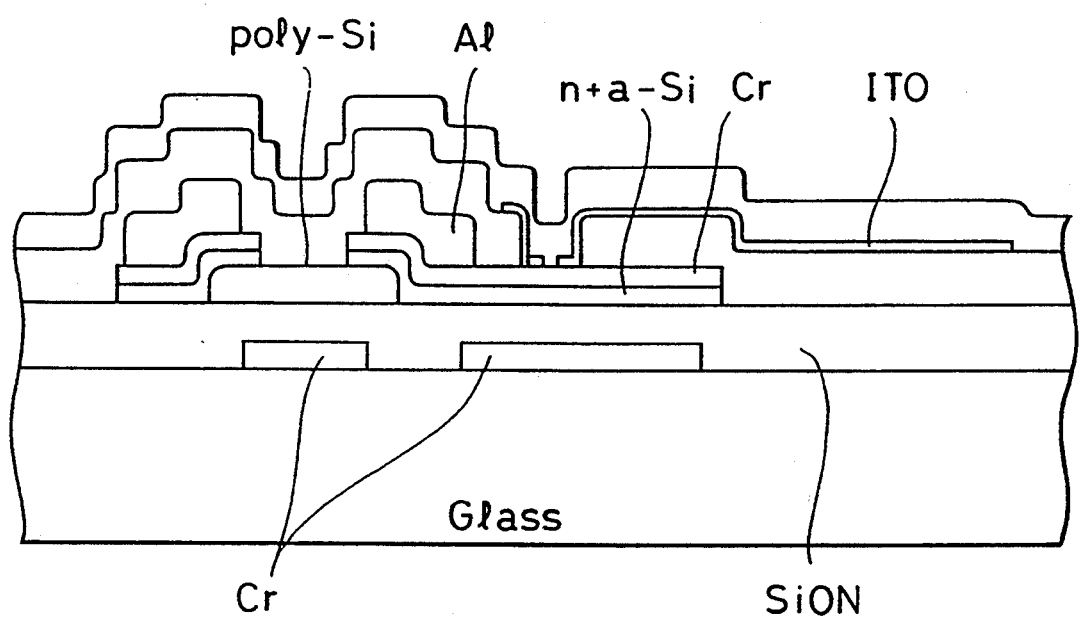
FIG. 15 is a vertical cross section of a liquid crystal electro-optical device using the prior art TFTs.

As shown in FIG. 13(F), a complementary structure was built from two TFTs. The output terminal of this complementary structure was connected with one transparent electrode for one pixel of a liquid-crystal. For this purpose, a film of indium tin oxide (ITO) was formed by sputtering. This film was etched, using a photomask (8) to form an electrode 70. This ITO film was created at a temperature between room temperature and 150° C. and annealed at 200° C. to 400° C. within an atmosphere of oxygen or air. In this way, the p-channel TFT 22, the n-channel TFT 13, and the electrode 70 consisting of a transparent conductive film were created on the same glass substrate 50. The electrical characteristics of the obtained TFTs were as follows. The mobility in the p-channel TFT was 20 cm$^2$/V·s and the threshold value V$_{th}$ was −5.9 V. The mobility in the n-channel TFT was 40 cm$^2$/V·s, and the threshold voltage V$_{th}$ was 5.0 V.

A uniform solution was prepared from denatured acrylic resin (such as manufactured by World Rock Co., Ltd, under the product name 880K1) which hardens when exposed to light and from a nematic liquid crystal (E44). The solution was applied to one substrate that was fabricated as described above for use in a liquid crystal display, by screen printing to a thickness of 10 μm. This substrate and another substrate having transparent electrodes over the whole surface were bonded together at a reduced pressure. A pressure of 2 kg/cm$^2$ was applied from above. At the same time, ultraviolet radiation was directed to the device from below to form a liquid crystal cell. The arrangement of the electrodes of this liquid crystal display is shown in FIG. 6. The n-channel TFT 13 was formed at the intersection of a first scanning line 5 and a data line 3. An n-channel TFT for other pixel was similarly formed at the intersection of the first scanning line 5 and a data line 4. Meanwhile, the p-channel TFT was formed at the intersection of a second scanning line 8 and the data line 3. An n-channel TFT for other pixel was formed at the intersection of another adjacent first scanning line 6 and the data line 3. Ill this way, a matrix structure using complementary TFT pairs was created. The n-channel TFT 13 was connected with the first scanning line 5 via the contact at the input terminal of a drain 10. A gate 9 was connected with the data line 3 in which multilayered interconnects were formed. The output terminal of a source 12 was connected with the pixel electrode 17 via a contact.

Meanwhile, with respect to the p-channel TFT 22, the input terminal of the drain 20 was connected to the second scanning line 8 via a contact. Its gate 21 was connected with the data line 3. The output terminal of the source 18 was connected with the pixel electrode 17 via a contact, in the same way as the n-channel TFT. In this way, one pixel 23 was constituted by the transparent pixel electrode 17 and the complementary TFTs between the scanning lines 5 and 8. This structure can be repeated horizontally and vertically to extend the matrix of 2×2 to a larger matrix of 640×480 or 1280×960. In this manner, a liquid crystal display having a large area can be manufactured.

Figure 9:
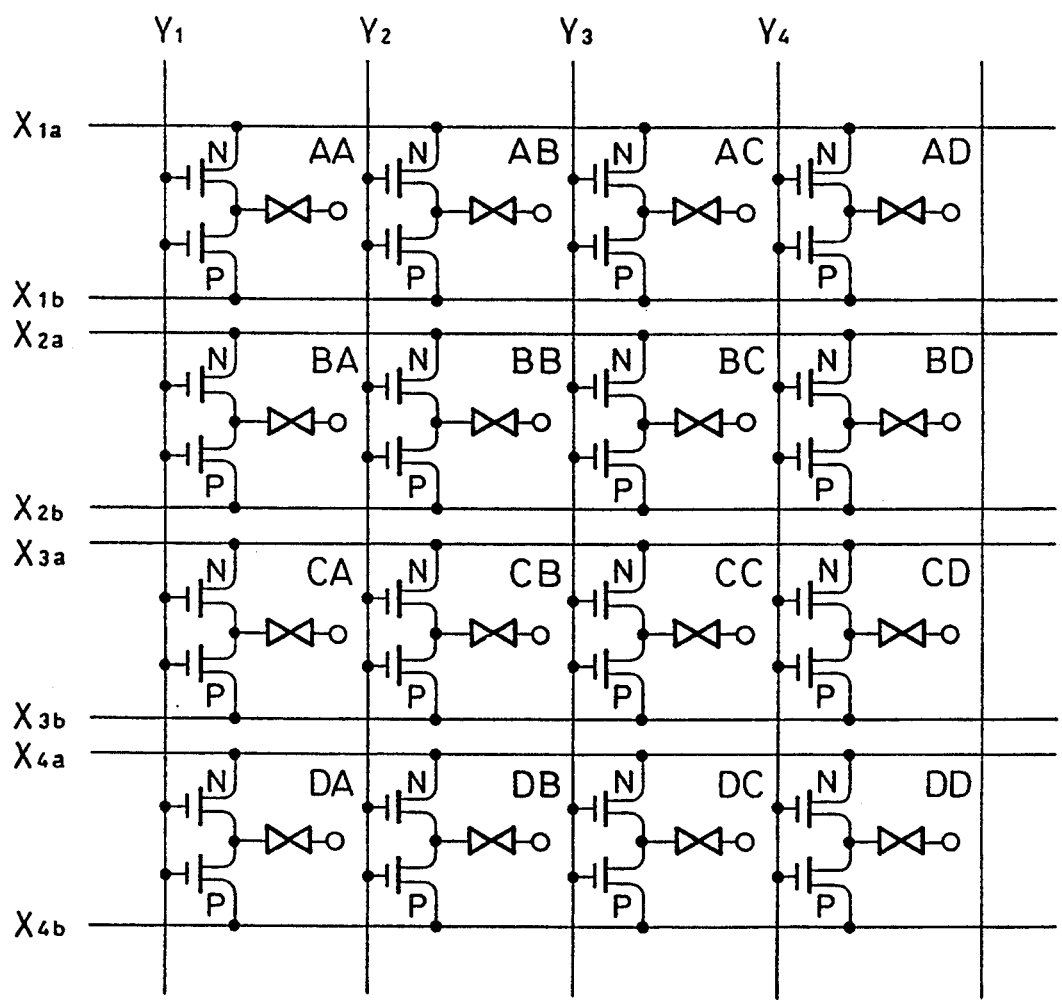
FIG. 9 is a circuit diagram of a 4×4 active liquid crystal display using complementary TFTs.

This structure is characterized in that the pixel electrode 17 is locked at any one of three values of the liquid-crystal potential V$_{LC}$ because a pair of complementary TFTs is provided for one pixel. The operation is next described by referring to FIGS. 9 and 10. FIG. 9 is a circuit diagram of a liquid crystal display having pixels arranged in 4 rows and 4 columns. FIG. 10 is a timing chart showing the waveforms of signals activating the display.

In the present example, each of pairs X$_{1a}$ and X$_{1b}$, X$_{2a}$ and X$_{2b}$, X$_{3a}$ and X$_{3b}$, and X$_{4a}$ and X$_{4b}$ acts as a pair of scanning lines. Y$_1$, Y$_2$, Y$_3$, and Y$_4$ serve as data lines. In FIG. 9, AA, AB, . . . , DD mean the addresses of pixels at the corresponding locations.

This liquid crystal display has pixels of a matrix of 4×4. FIG. 10 is a timing chart showing the waveforms of signals applied to the four pixels at the four addresses AA, AB, BA, and BB, the liquid-crystal potential, and the potential difference actually applied to the liquid crystal. In FIG. 10, the horizontal axis indicates time. It is assumed that one frame begins at instant of time T$_1$ and ends at instant of time $T_2$. This frame is divided into four. Four scanning line pairs are successively scanned to apply a scanning signal. In the figure, only $X_{1a}$, $X_{2a}$, $X_{3a}$, and $X_{4a}$ are shown. In practice, however, signals which are identical in waveshape with the signals applied to $X_{1a}$, $X_{2a}$, $X_{3a}$, and $X_{4a}$ but differ in polarity from these signals are applied to lines $X_{1b}$, $X_{2b}$, $X_{3b}$, and $X_{4b}$. Data signals as shown in FIG. 10 are applied to lines $Y_1$, $Y_2$, $Y_3$, and $Y_4$. During the period between instants $T_1$ and $T_2$, only pixel at the address AA is selected and activated or deactivated. In particular, a data signal is applied to the data line $Y_1$ during the period between instants $T_1$ and $t_1$. A voltage exceeding the threshold value is applied to the liquid crystal at the pixel at the address AA during this period to activate the liquid crystal. At this time, an offset voltage is applied to the counter electrode of the liquid Crystal display. In FIG. 10, exactly the same signal waveform is applied during the next period between instants $T_2$ and $T_3$ to activate the liquid crystal at the address AA.

During the period between instants $T_3$ and $T_4$ and during the period between instants $T_4$ and $T_5$, a signal is applied to select none of the four pixels. During the period between instants $T_5$ and $T_6$, a signal for selecting the pixel at the address AA again is applied.

During the period between instants $T_6$ and $T_8$, the signals applied to the data lines are inverted. An offset voltage which differs in polarity from the signal applied during the period between instants $T_1$ and $T_6$ is applied to the counter electrode. An AC signal is applied to the liquid crystal. The electric charge which was displaced in the positive direction during the period between instants $T_1$ and $T_6$ can be eliminated by this AC signal. Specifically, of the signal applied during the period between instants $T_2$ and $T_4$, the signals applied to the lines $Y_1$, $Y_2$, $Y_3$, and $Y_4$ are inverted, i.e., the select signals and non-select signals are interchanged. The polarity of the offset voltage applied to the counter electrode is inverted. In the first half, or one frame, of the period between the instants $T_2$ and $T_4$, the AC signal is applied and the liquid crystal is so activated that the pixel at the address AA is selected, while in the second half, or one frame, of the period, none of the four pixels are selected. In this way, the electric charge remaining on the pixels can be removed.

As described above the potential difference actually applied to the liquid crystal is the difference between the voltage applied to the third signal line, in the present example the pulse voltage applied to the data lines plus the offset voltage applied to the counter electrode, and the threshold voltage $V_{th}$ for the TFTs. Therefore, the potential difference actually applied to the liquid crystal can be controlled by controlling the pulse voltage. This permits display to be provided at various gray levels. This activation method is especially suitable for liquid crystals having no distinct threshold values, e.g., dispersion liquid crystals having smooth threshold values, and satisfactory gradation display can be provided.

In this way, in the novel activation method, the liquid crystal can be made to provide display simply by applying very simple pulse signals to the data lines and the scanning line pairs.

Another gradation display method is to apply activating signals for plural frames to one display screen. Where one screen is displayed, the number of the select signals applied to each one pixel can be made less than the total number of the frames. This facilitates gradation display.

No polarizing sheets are necessary in case of the dispersion liquid crystal display. In order to increase the switching speed of the liquid crystal, the operation voltage is set to ±10 to ±15 V. The spacing of the cell is set to about 1 to 20 μm.

Since the novel liquid crystal display using a dispersion liquid crystal needs no polarizing sheets, the quantity of light can be increased, whether the display is of the reflection type or of the transmission type. Furthermore, this liquid crystal has no threshold values. In the present invention, the complementary TFTs have clear threshold voltages. Therefore, a large contrast can be obtained. Also, crosstalk between successive pixels can be eliminated.

In the present example, the TFTs can be fabricated from materials other than the materials described above.

EXAMPLE 2

This example is executed, using the structure of the liquid crystal display shown in FIGS. 2 and 7. As can be seen from these figures, a scanning line 3 extending in the Y-direction is disposed in the center. One pixel 23 is formed between a first data line 5 and a second data line 8 of a pair of data lines. One pixel comprises a pixel electrode 17 made from a transparent conductive film and two complementary TFT pairs connected to the pixel electrode 17 and comprising two n-channel TFTs 13 and 24 and two p-channel TFTs 22 and 25. All the gate electrodes are connected to the scanning line 3. The two n-channel TFTs are connected with the first data line 5. The two p-channel TFTs are connected to the second data line 8. If any one of the two complementary TFT pairs malfunctions because of a leakage between the gate electrode and the channel formation region, the pixel functions normally.

Figure 11:
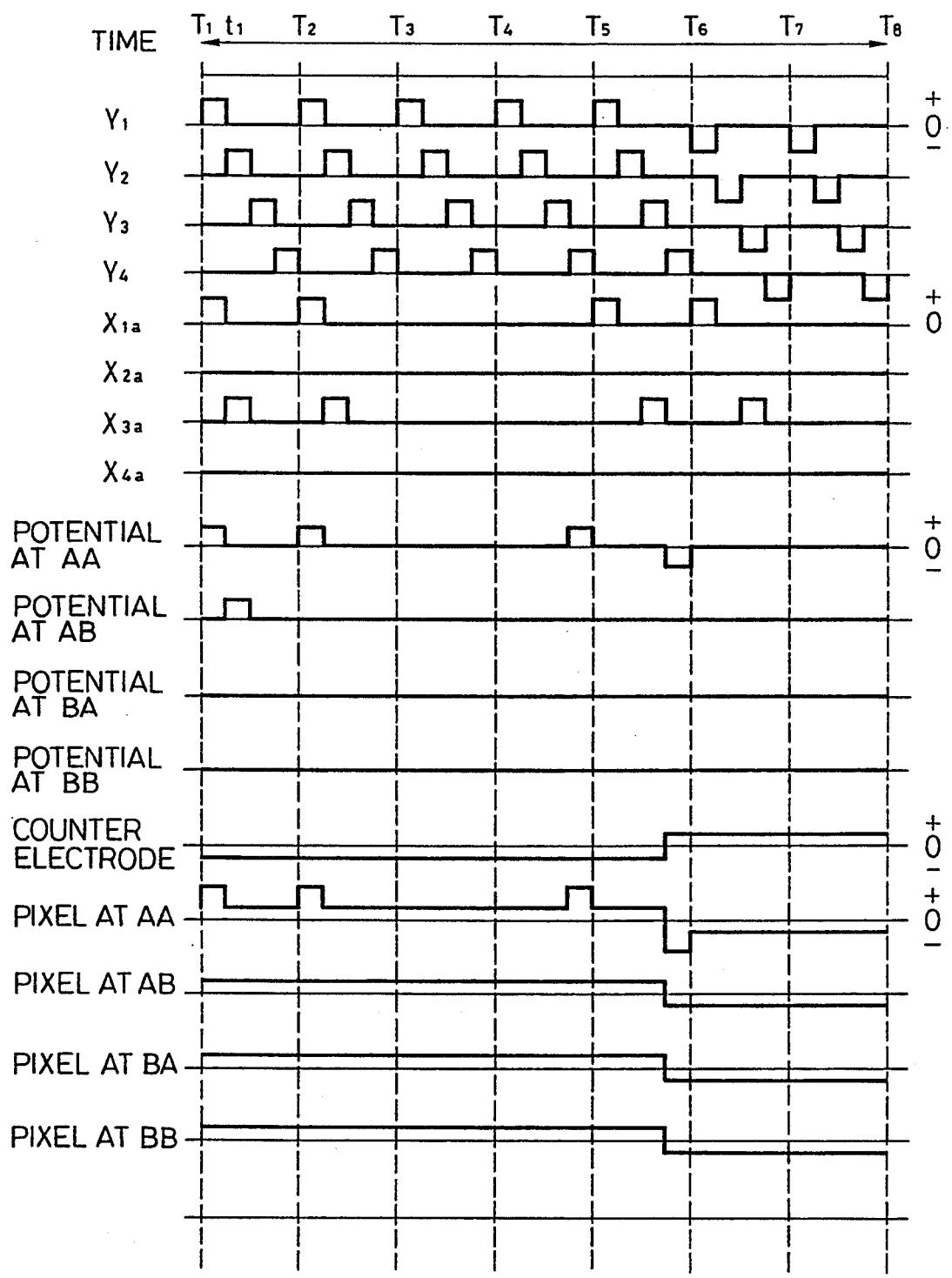
FIG. 11 is another timing chart of the waveforms of signals for driving liquid crystal displays according to the invention.

This structure is characterized in that the pixel electrode 17 is locked at any one of three values of the liquid-crystal potential $V_{LC}$ because two complementary TFT pairs are provided for one pixel. The operation is next described by referring to FIGS. 9 and 11. FIG. 9 is a circuit diagram of a liquid crystal display having a matrix structure of 4×4. FIG. 11 is a timing chart of the waveforms of signals activating the display.

In the present example, each of pairs $X_{1a}$ and $X_{1b}$, $X_{2a}$ and $X_{2b}$, $X_{3a}$ and $X_{3b}$, and $X_{4a}$ and $X_{4b}$ acts as a pair of data lines. $Y_1$, $Y_2$, $Y_3$ and $Y_4$ serve as scanning lines. In FIG. 9, AA, AB, . . . , DD mean the addresses of pixels at the corresponding locations.

This liquid crystal display has pixels of a matrix of 4×4. FIG. 11 is a timing chart showing the waveforms of signals applied to the four pixels at the four addresses AA, AB, BA, and BB, the liquid-crystal potential, and the potential difference actually applied to the liquid crystal. In FIG. 11, the horizontal axis indicates time. It is assumed that one frame begins at instant $T_1$ and ends at instant $T_2$. This frame is divided into four. Scanning lines $Y_1$, $Y_2$, $Y_3$, and $Y_4$ are successively scanned to apply a scanning signal. Data signals as shown in FIG. 11 are applied to $X_1$, $X_2$, $X_3$, and $X_4$ lines. In the figure, only $X_{1a}$, $X_{2a}$, $X_{3a}$, and $X_{4a}$ are shown. In practice, however, signals which are identical in waveshape with the signals applied to $X_{1a}$, $X_{2a}$, $X_{3a}$, and $X_{4a}$ but differ in polarity from these signals are applied to lines $X_{1b}$, $X_{2b}$, $X_{3b}$, and $X_{4b}$. During the period between instants $T_1$ and $T_2$, only pixel at the address AA is selected and activated or deactivated. In particular, a data signal is applied to the data line $X_1$ during the period between instants $T_1$ and $t_1$. A voltage exceeding the threshold value is applied to the liquid crystal at the pixel at the address AA during this period to activate the liquid crystal. At this time, an offset voltage (electric potential) is applied to the counter electrode of the liquid crystal display. In FIG. 11, exactly the same signal waveform is applied during the next period between instants $T_2$ and $T_3$ to activate the liquid crystal at the address AA.

During the period between instants $T_3$ and $T_4$ and during the period between instants $T_4$ and $T_5$, a signal is applied to select none of the four pixels. During the period between instants $T_5$ and $T_6$, a signal for selecting the pixel at the address AA again is applied.

During the period between instants $T_6$ and $T_8$, the signals applied to the data lines are inverted. An offset voltage (electric potential) which differs in polarity from the signal applied during the period between instants $T_1$ and $T_6$ is applied to the counter electrode. An AC signal is applied to the liquid crystal. The electric charge which was displaced in the positive direction during the period. between instants $T_1$ and $T_6$ can be eliminated by this AC signal. Specifically, of the signal applied during the period between instants $T_2$ and $T_4$, the signals applied to the lines $X_1$, $X_2$, $X_3$, and $X_4$ are inverted, i.e., the select signals and non-select signals are interchanged. The polarity of the offset voltage applied to the counter electrode is inverted. In the first half, or one frame, of the period between the time $T_2$ and the time $T_4$, the AC signal is applied and the liquid crystal is so activated that the pixel at the address AA is selected, while in the second half, or one frame, of the period, none of the four pixels are selected. In this way, the liquid crystal is activated.

In this manner, in the novel activation method, the liquid crystal can be made to provide display simply by applying very simple pulse signals to the data lines and the scanning line pairs. Also, gradation display can be provided by varying the signal voltages applied to the scanning lines, in the same way as in Example 1.

EXAMPLE 3

This example is executed, using the structure of the liquid crystal display shown in FIGS. 3 and 6. As can be seen from these figures, a data line 3 extending in the Y-direction is disposed in the center. One pixel 23 is formed between a first scanning line 5 and a second scanning line 8 of a pair of scanning lines. One pixel comprises two pixel electrodes 17 and 26 consisting of a transparent conductive film. A complementary TFT pair consisting of an n-channel TFT 13 and a p-channel TFT 22 is connected with the pixel electrode 17 . A complementary TFT pair consisting of an n-channel TFT 24 and a p-channel TFT 25 is connected with the pixel electrode 26. All the gate electrodes are connected to the data line 3. The two n-channel TFTs are connected with the first scanning line 5. The two p-channel TFTs are connected to the second scanning line 8. If any one of the two complementary TFT pairs malfunctions because of a leakage between the gate electrode and the channel formation region, the pixel functions normally. Therefore, if one pixel electrode should fail to operate satisfactorily, the other pixel electrode operates normally. Where the device is a color liquid crystal display, deterioration in the gray scale can be alleviated.

Figure 12:
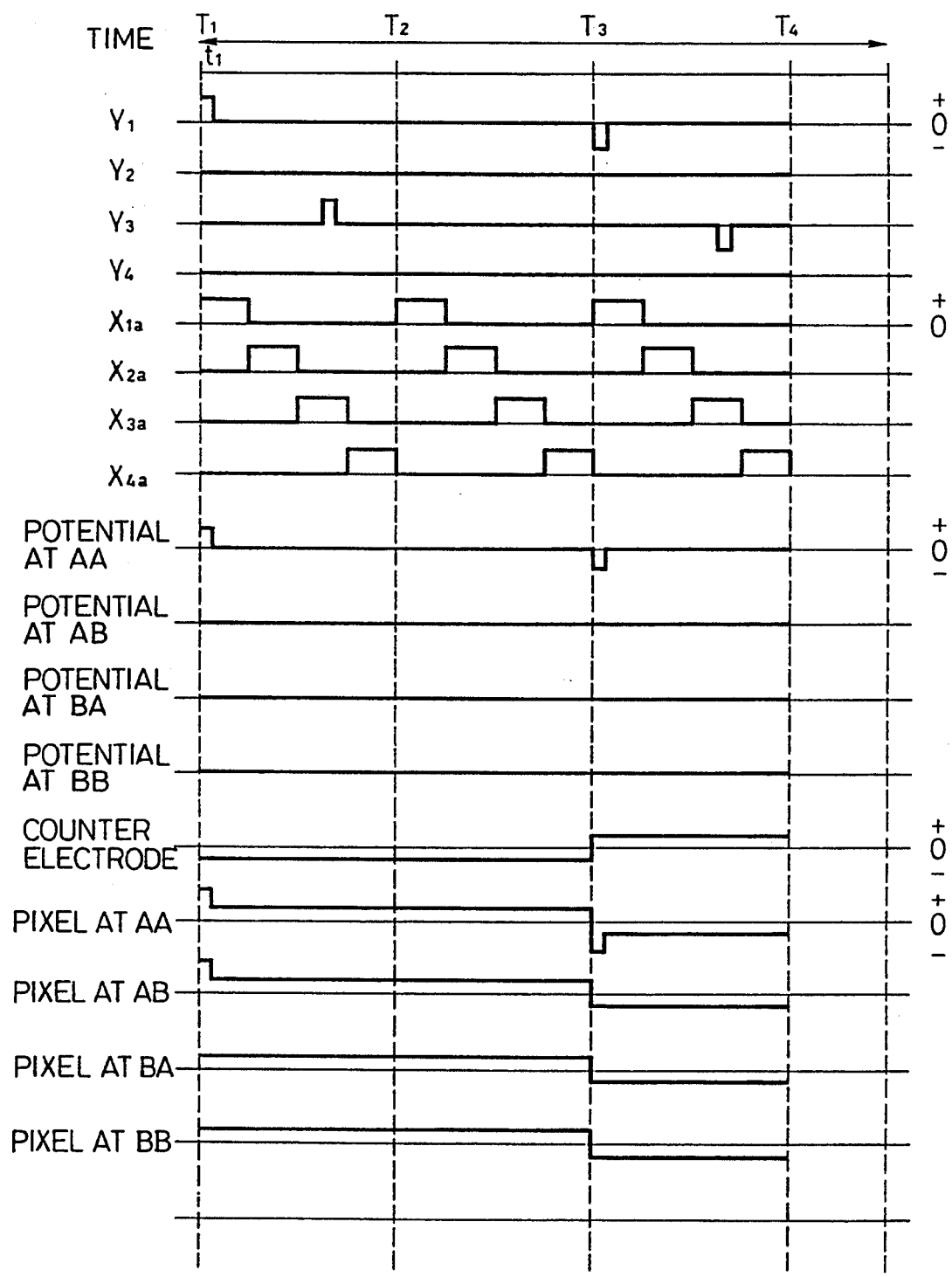
FIG. 12 is a further timing chart of the waveforms of signals for driving liquid crystal displays according to the invention.

The operation is next described by referring to FIGS. 9 and 12. FIG. 9 is a circuit diagram of a liquid crystal display having a matrix structure of 4×4. FIG. 12 is a timing chart of the waveforms of signals activating the display.

In the present example, each of pairs $X_{1a}$ and $X_{1b}$, $X_{2a}$ and $X_{2b}$, $X_{3a}$ and $X_{3b}$, and $X_{4a}$ and $X_{4b}$ acts as a pair of scanning signal lines. $Y_1$, $Y_2$, $Y_3$, and $Y_4$ serve as data lines. In FIG. 9, AA, AB, ..., DD mean the addresses of pixels at the corresponding locations.

This liquid crystal display has pixels of a matrix of 4×4. FIG. 12 is a timing chart showing the waveforms of signals applied to the four pixels at the four addresses AA, AB, BA, and BB, the liquid-crystal potential, and the potential difference actually applied to the liquid crystal. In FIG. 12, the horizontal axis indicates time. It is assumed that one frame begins at instant $T_1$ and ends at instant $T_2$. This frame is divided into 16. The four scanning line pairs are successively scanned to apply a scanning signal. Although only lines $X_{1a}$, $X_{2a}$, $X_{3a}$, and $X_{4a}$ are shown in the figure, signals which are identical in waveform with the signals applied to the lines $X_{1a}$, $X_{2a}$, $X_{3a}$, and $X_{4a}$ but differ in polarity from these signals are applied to the lines $X_{1b}$, $X_{2b}$, $X_{3b}$, and $X_{4b}$. Data signals as shown in Fig. 12 are applied to lines $Y_1$, $Y_2$, $Y_3$, and $Y_4$. The timing is determined by the addresses, of the selected pixels. A data signal is applied to the data lines during a certain one of the 16 periods within one frame. The duration of the signal applied to the line $Y_1$, $Y_2$, $Y_3$, or $Y_4$ is one-fourth as long as that of the signal applied to $X_{1a}$, $X_{1b}$, $X_{2a}$, $X_{2b}$, $X_{3a}$, $X_{3b}$, $X_{4a}$, or $X_{4b}$. During the period between instants $T_1$ and $T_2$, only the pixel at the address AA is selected and activated or deactivated. In particular, a data signal is applied to the data line $Y_1$ during the period between instants $T_1$ and $t_1$. A voltage exceeding the threshold value is applied to the liquid crystal at the pixel at the address AA during this period to activate the liquid crystal. At this time, an offset voltage is applied to the counter electrode of the liquid crystal display. During the succeeding period between instants $T_2$ and $T_3$, a signal is applied to select none of the four pixels.

During the period between instants $T_3$ and $T_4$, the signals applied to the data lines are inverted. An offset voltage which differs in polarity from the signal applied during the period between instants $T_1$ and $T_3$ is applied to the counter electrode. An AC signal is applied to the liquid crystal. The electric charge which was displaced in the positive direction during the period between instants $T_1$ and $T_3$ can be eliminated by this AC signal. Specifically, of the signals applied during the period between instants $T_1$ and $T_2$, the signals applied to the lines $Y_1$, $Y_2$, $Y_3$, and $Y_4$ are inverted, i.e., the select signals and non-select signals are interchanged. The polarity of the offset voltage applied to the counter electrode is inverted. In the first half of the frame, the AC signal is applied and the liquid crystal is so activated that the pixel at the address AA is selected, while in the second half of the frame, none of the four pixels are selected.

In this way, in the novel activation method, the liquid crystal can be made to provide display simply by applying very simple pulse signals to the data lines and the scanning line pairs. In the present example, the Y lines are taken as the scanning lines. The invention is not limited to this scheme. It is also possible that the X lines are taken as the scanning lines. Furthermore, data signals may be applied to the data lines at random, and pixels may be selected at random. This example is similar to Examples 1 and 2 in other respects,

EXAMPLE 4

A liquid crystal display of the circuit configuration of FIG. 16 was used. The arrangement of electrodes and other components corresponding to this circuit configuration is shown in FIG. 20. To simplify the illustration, only the portion which corresponds to a matrix portion of 2×2 is shown.

Circuits, electrodes, etc. (FIGS. 16 and 20) on a first substrate were fabricated in the same way as in Example 1. A second substrate having transparent electrodes over the whole surface was bonded to the first substrate to form a liquid crystal cell. A twisted nematic liquid crystal material was injected into the cell. The arrangement of the electrodes of this liquid crystal display is shown in FIG. 20. An n-channel TFT 113 was formed at the intersection of a first scanning line 105 and a third signal line 103. An n-channel TFT for other pixel was similarly formed at the intersection of the first scanning line 105 and another third signal line 104, A p-channel TFT was formed at the intersection of the second signal line 108 and the third signal line 103. A p-channel TFT for other pixel was formed at the intersection of an adjacent first scanning line 106 and the third signal line 103, Similarly, a p-channel TFT was formed at the intersection of the first signal line 106 and the third signal line 104 . In this way, a matrix structure using complementary TFT pairs was created. The n-channel TFT 113 was connected with the first scanning line 105 via the contact at the input terminal of a drain 110. A gate 109 was connected with the signal line 103 in which multilayered interconnects were formed. The output terminal of a source 112 was connected with a pixel electrode 117 via a contact.

Meanwhile, with respect to a p-channel TFT 122, the input terminal of the drain 120 was connected to the second scanning line 108 via a contact. Its gate 121 was connected with the signal line 103. The output terminal of the source 118 was connected with the pixel electrode 117 via a contact, in the same way as in the case of the n-channel TFT. With respect to the adjacent complementary TFT pair connected with the same third signal line, the p-channel TFT 522 is connected with the second signal line 106, while the n-channel TFT 513 is connected with the first signal line 107. The second signal lines which were connected to the p-channel TFTs were adjacent to each other. In this way, one pixel 123 was formed by a pixel electrode 117 and the complementary TFTs between the signal lines 105 and 108. The pixel electrode 117 consisted of a transparent conductive film. This structure can be repeated horizontally and vertically to extend the matrix of 2×2 to a larger matrix of 640×480 or 1280×960. In this manner, a liquid crystal display having a large number of pixels can be manufactured.

This structure is characterized in that the pixel electrode 117 is locked at any one of three values of the liquid-crystal potential $V_{LC}$ because two complementary TFT pairs are provided for one pixel. Furthermore, only a small amount of leakage occurs, because the p-channel TFTs are adjacent to each other, and because the maximum value of the potential difference applied between the signal lines connected to these p-channel TFTs is only $V_{SS}$.

As described above, the potential difference actually applied to the liquid crystal is the difference between the voltage applied to the third signal line, in the present example the pulse voltage applied to the data lines plus the offset voltage applied to the counter electrode, and the threshold voltage $V_{th}$ for the TFTs. That is, if the pulse voltage applied to the signal lines is varied, the potential difference actually applied to the liquid crystal varies accordingly. This permits display to be provided at various gray levels. This activation method is especially suitable for liquid crystals having no distinct threshold values, e.g., dispersion liquid crystals having smooth threshold values, and satisfactory gradation display can be provided.

Another gradation display method is to apply activating signals for plural frames to one display screen. Where one screen is displayed, the number of the select signals applied to each one pixel can be made less than the total number of the frames. This facilitates gradation display.

In the present example, where a twisted nematic liquid crystal material is used, the spacing between the substrates is about 10 μm. Orientation films are formed on both transparent conductive films. The orientation films are required to be rubbed.

Where a ferroelectric liquid crystal material is employed, the operation voltage is set to ±20 V. The spacing of the cell is set to 1.5 to 3.5 μm, for example, 2.3 μm. An orientation film is formed only on the counter electrode 116 and rubbed.

Where a dispersion liquid crystal or polymeric liquid crystal is used, no orientation film is needed. To increase the switching speed, the operation voltage is set to ±10 to ±15 V. The spacing of the cell is set to only 1 to 10 μm.

Especially, where a dispersion liquid crystal is used, no polarizing sheets are needed, so the quantity of light can be increased, whether the display is of the reflection type or of the transmission type. Furthermore, this liquid crystal has no threshold values. In the present invention, the complementary TFTs have clear threshold voltages. Therefore, a large contrast can be obtained. Also, crosstalk between successive pixels can be eliminated.

EXAMPLE 5

This example is executed, using the structure of the liquid crystal display shown in FIGS. 17 and 21. As can be seen from these figures, a signal line 103 extending in the Y-direction is disposed in the center. One pixel 123 is formed between a first signal line 105 and a second signal line 108 of a pair of signal lines. One pixel is connected with a pixel electrode 117 consisting of a transparent conductive film and with two complementary TFT pairs comprising two n-channel TFTs 113 and 124 and two p-channel TFTs 122 and 125. All the gate electrodes are connected to the third signal line 103. The two n-channel TFTs are connected with the second signal line 108. The two p-channel TFTs are connected to the first signal line 105. n-channel TFTs of complementary TFT pairs for an adjacent pixel are connected with the second signal line 106, while p-channel TFTs are connected with the first signal line 107. If any one of the two complementary TFT pairs of one pixel malfunctions because of a leakage between the gate electrode and the channel formation region, the pixel functions normally.

This structure is characterized in that the pixel electrode 117 is locked at any one of three values of the liquid-crystal potential $V_{LC}$ because two complementary TFT pairs are provided for one pixel. Furthermore, only a small amount of leakage occurs, because the n-channel TFTs of adjacent pixels are adjacent to each other, and because the maximum value of the potential difference applied between the signal lines connected to these n-channel TFTs is only $V_{SS}$.

Figure 18:
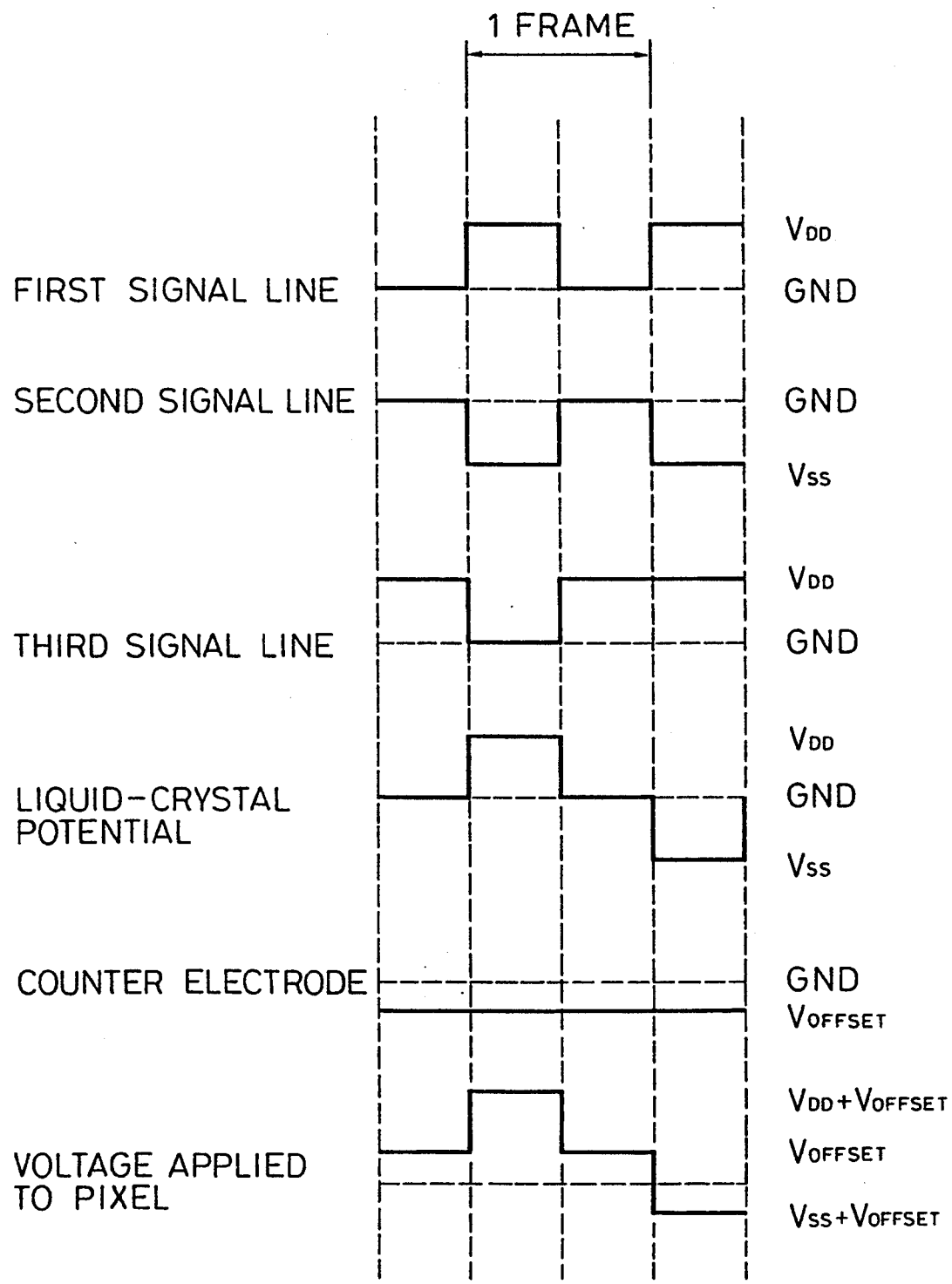
FIG. 18 is a waveform diagram of signals used to drive active display devices according to the invention.

A method of activating this structure is now described by referring to FIG. 18. As shogun in this figure, when an ON signal is applied to the third signal line 103 while an ON signal is being applied to the first signal line 105 and to the second signal line 108, the liquid-crystal potential ($V_{LC}$) 114 is equal to the voltage $V_{DD}$ applied to the first signal line. When an OFF signal is applied to the third signal line 103 while an OFF signal is being applied between the first signal line 105 and the second signal line 108 which form a pair, the liquid-crystal potential ($V_{LC}$) 114 is null (ground level). When an ON signal is not applied to the third signal line 103 while an OFF signal is being applied between the first signal line 105 and the second signal line 108 forming a pair, the liquid-crystal potential ($V_{LC}$) 114 is equal to the voltage $V_{SS}$ applied to the second signal line. Thus, the liquid-crystal potential ($V_{LC}$) 114 is locked either at $V_{DD}$ or at $V_{SS}$. Hence, floating condition does not take place.

EXAMPLE 6

This example is executed, using the structure of the liquid crystal display shown in FIGS. 19 and 22. As can be seen from these figures, a signal line 103 extending in the Y-direction is disposed in the center. One pixel 123 is formed between a first signal line 105 and a second signal line 108 of a pair of signal lines, and comprises two pixel electrodes 117 and 126 consisting of a transparent conductive film. A complementary TFT pair consisting of an n-channel TFT 113 and a p-channel TFT 122 is connected with the pixel electrode 117. A complementary TFT pair consisting of an n-channel TFT 124 and a p-channel TFT 125 is connected with the pixel electrode 126. All the gate electrodes are connected to the signal line 103. The two n-channel TFTs are connected with the first scanning line 105. The two p-channel TFTs are connected to the second signal line 108. With respect to the complementary TFTs provided for an adjacent pixel, the p-channel TFTs are connected to the second signal line 106, while the n-channel TFTs are connected to the first signal line 107. If any one of the two complementary TFT pairs malfunctions because of a leakage between the gate electrode and the channel formation region, the pixel functions normally. Therefore, if one pixel electrode should fail to operate satisfactorily, the other pixel electrode operates normally. Where the device is a color liquid crystal display, deterioration in the gray scale can be alleviated.

In the present example, the two second signal lines 108 and 106 which are formed between adjacent pixels are made of the same material. First, this material is deposited on a substrate. Then, the material is patterned to form one interconnect. Subsequently, this interconnect is divided into two by irradiation of an excimer laser beam. As a result, the two signal lines are formed. In this case, the spacing between the two signal lines can be made small. Also, the numerical aperture ratio of the display device can be improved. Furthermore, accuracy required for the mask used in the manufacturing process is not very strict. Consequently, the production yield can be enhanced. Further, the costs of the mask can be reduced.

As described thus far, in the novel activation method, the liquid crystal is not at floating potential and so stable display can be provided. Also, the complementary TFTs acting as active devices are excellent in ability to activate liquid crystal. This allows the operation margin to be extended. In addition, the peripheral driving circuits can be made simpler. This is effective in reducing the size of the display device and the manufacturing cost. Moreover, the liquid crystal can be activated very well merely by applying very simple signals to the three signal lines and to the counter electrode. If any one of the TFTs is defective, it can be compensated for to some extent, because the outputs are in phase. Further, no leakage occurs, because a high potential difference is not applied between the signal lines connected to adjacent pixel electrodes. Additionally, the numerical aperture ratio of the display device can be enhanced, since the adjacent signal lines can be spaced close to each other.

A transmission liquid crystal display or reflection liquid crystal display can be used as a display medium according to the present invention. Usable liquid crystal materials include the aforementioned twisted nematic liquid crystals, ferroelectric liquid crystals, dispersion liquid crystals, and polymeric liquid crystals (polymer liquid crystals). Also, phase transition liquid crystals can also be utilized. These phase transition liquid crystals are fabricated in the manner described now. Dopant ions are added to nematic liquid crystals of the guest host type or of the anisotropic dielectric type. An electric field is applied to these liquid crystals, thus producing nematic liquid crystals. The obtained nematic liquid crystals are mixed with cholesteric liquid crystals. An electric field is applied to the mixtures, so that a phase transition takes place between the nematic phase and the cholesteric phase. In this way, the display is made either transparent or opaque. With respect to materials other than liquid crystals, media for so-called electrophoretic displays can be used. These media are prepared by dispersing pigment particles in organic solvents colored, for example, with dyestuffs which differ in color from the pigment particles.

In order to prevent the liquid crystal material from being electrolyzed, it is essential that an AC signal is applied. This application of the AC signal is easily achieved by inverting the signal applied to the gate signal lines of the complementary TFTs and inverting the polarity of the offset voltage applied to the counter electrode.

If the voltage of the signal applied to the third signal line is varied at will, then the potential difference actually applied to the liquid crystal is varied accordingly. This permits gradation display. This activation method is especially suited for liquid crystals having mild (smooth) threshold values, for example dispersion liquid crystals. In this case, satisfactory gradation display can be provided. Where signals for driving plural frames are applied to a liquid crystal to display one viewing screen, the number of the select signals applied to each one pixel is made fewer than the total number of the frames. Hence, gradation display can be readily attained.

The foregoing description of preferred embodiments has been presented for purposes of illustration and description. It is not intended to be exhaustive or to limit the invention to the precise form described, and obviously many modifications and variations are possible in light of the above teaching. The embodiments were chosen in order to explain most clearly the principles of the invention and its practical application thereby to enable others in the art to utilize most effectively the invention in various embodiments and with various modifications as are suited to the particular use contemplated.

What is claimed is:

1. An electro-optical device comprising:
    a pair of substrates at least one of which is transparent;
    an electro-optical modulating layer disposed between said substrates; and
    at least two pixels,
    wherein one of said two pixels is provided with complementary transistors comprising an n-channel transistor and a p-channel transistor provided on an inside of one of said substrates;
    an electrode provided on said inside of one of said substrates and connected to one of drain and source terminals of said n-channel transistor and one of drain and source terminals of said p-channel transistor;
    a pair of row control lines one of which is connected to the other one of the drain and source terminals of said n-channel transistor and the other one of which is connected to the other one of the drain and source terminals of said p-channel transistor; and
    a column control line connected to gate terminals of said n-channel transistor and said p-channel transistor,
    wherein another one of said two pixels is provided with other complementary transistors comprising another n-channel transistor and another p-channel transistor provided on said inside of one of said substrates;
    another electrode provided on said inside of one of said substrates and connected to one of drain and source terminals of said another n-channel transistor and one of drain and source terminals of said another p-channel transistor; and
    another pair of row control lines one of which is connected to the other one of the drain and source terminals of said another n-channel transistor and the other one of which is connected to the other one of the drain and source terminals of said another p-channel transistor,
    wherein gate terminals of said another n-channel transistor and said another p-channel transistor are connected to said column control line and the row control line connected to the other one of the drain and source terminals of said n-channel transistor of said one of said two pixels is adjacent to the row control line connected to the other one of the drain and source terminals of said another n-channel transistor.

2. The electro-optical device of claim 1 wherein the row control line connected to the other one of the drain and source terminals of said another n-channel transistor is separate from the row control line adjacent thereto.

3. The electro-optical device of claim 1 wherein said electro-optical modulating layer comprises a transparent solid and a material comprising a liquid crystal and said material comprising a liquid crystal is dispersed in said transparent solid in the form of granules.

4. The electro-optical device of claim 1 wherein said electro-optical modulating layer comprises a liquid crystal selected from the group consisting of a ferroelectric liquid crystal, a polymer liquid crystal, a liquid crystal for use in twisted nematic type liquid crystal device, a liquid crystal for use in dispersion type liquid crystal device, a liquid crystal for use in guest-host type liquid crystal device, and a liquid crystal for use in phase-transition type liquid crystal device.

5. The electro-optical device of claim 1 wherein said two pixels are adjacent to each other.

6. An electro-optical device comprising:
    a pair of substrates at least one of which is transparent;
    an electro-optical modulating layer disposed between said substrates; and
    at least two pixels,
    wherein one of said two pixels is provided with complementary transistors comprising an n-channel transistor and a p-channel transistor provided on an inside of one of said substrates;
    an electrode provided on said inside of one of said substrates and connected to one of drain and source terminals of said n-channel transistor and one of drain and source terminals of said p-channel transistor;
    a pair of row control lines one of which is connected to the other one of the drain and source terminals of said n-channel transistor and the other one of which is connected to the other one of the drain and source terminals of said p-channel transistor; and
    a column control line connected to gate terminals of said n-channel transistor and said p-channel transistor,
    wherein another one of said two pixels is provided with other complementary transistors comprising another n-channel transistor and another p-channel transistor provided on said inside of one of said substrates;
    another electrode provided on said inside of one of said substrates and connected to one of drain and source terminals of said another n-channel transistor and one of drain and source terminals of said another p-channel transistor; and
    another pair of row control lines one of which is connected to the other one of the drain and source terminals of said another n-channel transistor and the other one of which is connected to the other one of the drain and source terminals of said another p-channel transistor;
    wherein gate terminals of said another n-channel transistor and said another p-channel transistor are connected to said column control line and the row control line connected to the other one of the drain and source terminals of said p-channel transistor of said one of said two pixels is adjacent to the row control line connected to the other one of the drain and source terminals of said another p-channel transistor.

7. The electro-optical device of claim 6 wherein the row control line connected to the other one of the drain and source terminals of said another p-channel transistor is separate from the row control line adjacent thereto.

8. The electro-optical device of claim 6 wherein said electro-optical modulating layer comprises a transparent solid and a material comprising a liquid crystal and said material comprising a liquid crystal is dispersed in said transparent solid in the form of granules.

9. The electro-optical device of claim 6 wherein said electro-optical modulating layer comprises a liquid crystal selected from the group consisting of a ferroelectric liquid crystal, a polymer liquid crystal, a liquid crystal for use in twisted nematic type liquid crystal device, a liquid crystal for use in dispersion type liquid crystal device, a liquid crystal for use in guest-host type liquid crystal device, and a liquid crystal for use in phase-transition type liquid crystal device.

10. The electro-optical device of claim 6 wherein said two pixels are adjacent to each other.

11. An active matrix display device comprising:
a light modulating layer having a plurality of pixels wherein each said pixel is provided with at least two pixel electrodes and at least two thin film semiconductor devices formed on a substrate, with one connected to each of said pixel electrodes;
an electrode arrangement comprising a plurality of column lines and a plurality of row lines; and
a peripheral circuit comprising a plurality of thin film transistors formed on said substrate, where a channel semiconductor layer of each of said transistors has a crystalline structure,
wherein the thin film semiconductor devices associated with each pixel are connected to one of said column lines in common.

12. The device of claim 11 wherein each of the thin film semiconductor devices associated with one of said pixels is connected to one of said row lines, individually.

13. The device of claim 11 wherein said thin film semiconductor devices associated with each said pixel comprise at least a pair of transistors, said pair including a p-channel transistor and an n-channel transistor.

14. The device of claim 11 wherein said light modulating layer comprises a liquid crystal.

15. The device of claim 14 wherein said liquid crystal is a polymer-dispersed liquid crystal.

16. An active matrix display device comprising:
a glass substrate;
a plurality of pairs of pixel electrodes formed on said substrate, each pair constituting one pixel;
a plurality of thin film semiconductor devices formed on said substrate, with one connected to each of said pixel electrodes;
a peripheral circuit comprising thin film transistors formed on said substrate,
wherein said thin film transistors of said peripheral circuit include channel semiconductor layers having at least one of an electron mobility of 15–300 $cm^2/V \cdot s$ and a hole mobility of 10–200 $cm^2/V \cdot s$.

17. The device of claim 16 wherein said channel semiconductor layers comprise silicon in which oxygen is contained at a concentration not higher than $7 \times 10^{19}$ atoms/$cm^3$.

18. An active matrix display device comprising:
a glass substrate;
a plurality of pairs of pixel electrodes formed on said substrate, each pair constituting one pixel;
a plurality of this film semiconductor devices formed on said substrate, with one connected to each of said pixel electrodes;
a peripheral circuit comprising thin film transistors formed on said substrate,
wherein said thin film transistors of said peripheral circuit have a channel semiconductor layer comprising silicon in which oxygen is contained at a concentration not higher than $7 \times 10^{19}$ atoms/$cm^3$.

* * * * *

UNITED STATES PATENT AND TRADEMARK OFFICE
CERTIFICATE OF CORRECTION

PATENT NO. : 5,383,041
DATED : January 17, 1995
INVENTOR(S) : Shunpei Yamazaki

It is certified that error appears in the above-identified patent and that said Letters Patent is hereby corrected as shown below:

In column 24, line 26, change "this" to --thin--.

Signed and Sealed this

Seventeenth Day of October, 1995

Attest:

BRUCE LEHMAN

*Attesting Officer*  *Commissioner of Patents and Trademarks*